(12) United States Patent
Wu

(10) Patent No.: US 11,449,102 B2
(45) Date of Patent: Sep. 20, 2022

(54) ELECTRONIC DEVICE

(71) Applicant: GUANGDONG OPPO MOBILE TELECOMMUNICATIONS CORP., LTD., Guangdong (CN)

(72) Inventor: Anping Wu, Dongguan (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 943 days.

(21) Appl. No.: 16/231,266

(22) Filed: Dec. 21, 2018

(65) Prior Publication Data
US 2019/0196546 A1 Jun. 27, 2019

(30) Foreign Application Priority Data

Dec. 26, 2017 (CN) .......... 201711433084.8
Dec. 26, 2017 (CN) .......... 201711433116.4
(Continued)

(51) Int. Cl.
G06F 1/16 (2006.01)
H05K 5/02 (2006.01)
(Continued)

(52) U.S. Cl.
CPC .......... *G06F 1/1637* (2013.01); *G01J 1/0204* (2013.01); *G01J 1/0219* (2013.01);
(Continued)

(58) Field of Classification Search
CPC .. H04N 5/2251; H04N 5/2252; H04N 5/2254; H04N 5/2257;
(Continued)

(56) References Cited

U.S. PATENT DOCUMENTS

2010/0295781 A1 11/2010 Alameh
2014/0246592 A1 9/2014 Kuo et al.
(Continued)

FOREIGN PATENT DOCUMENTS

CN 103050089 A 4/2013
CN 103515371 A 1/2014
(Continued)

OTHER PUBLICATIONS

Office Action of the Indian application No. 201814048952, dated Mar. 18, 2021.
(Continued)

*Primary Examiner* — Paul M Berardesca
(74) *Attorney, Agent, or Firm* — Ladas & Parry, LLP

(57) ABSTRACT

An electronic device is provided, which includes an enclosure, an output component, a display screen and an optical sensor. The output component and the display screen are mounted on the enclosure. The output component includes a packaging shell, an infrared supplementary lighting lamp and a proximity infrared lamp; the packaging shell includes a packaging substrate; the infrared supplementary lighting lamp and the proximity infrared are packaged in the packaging shell and born on the packaging substrate. The display screen is provided with a non-opaque entity region and includes a front surface capable of displaying a picture and a back surface back on to the front surface. The optical sensor is arranged on a side, where the back surface is positioned, of the display screen and corresponds to the non-opaque entity region.

20 Claims, 13 Drawing Sheets

(30) Foreign Application Priority Data

| Dec. 26, 2017 | (CN) | 201711437245.0 |
| Dec. 26, 2017 | (CN) | 201711437255.4 |
| Dec. 26, 2017 | (CN) | 201711437455.X |

(51) Int. Cl.

| *G01S 17/04* | (2020.01) |
| *H04M 1/02* | (2006.01) |
| *H05K 1/18* | (2006.01) |
| *H04N 5/225* | (2006.01) |
| *H01L 23/552* | (2006.01) |
| *H01L 31/101* | (2006.01) |
| *G01J 1/02* | (2006.01) |
| *G01J 5/02* | (2022.01) |
| *G01J 1/06* | (2006.01) |
| *G01J 5/0806* | (2022.01) |
| *G01S 7/481* | (2006.01) |
| *G01J 1/42* | (2006.01) |
| *G01J 5/04* | (2006.01) |
| *G01J 1/04* | (2006.01) |
| *H04M 1/72448* | (2021.01) |
| *H01L 25/16* | (2006.01) |

(52) U.S. Cl.
CPC .......... *G01J 1/0233* (2013.01); *G01J 1/0271* (2013.01); *G01J 1/0411* (2013.01); *G01J 1/06* (2013.01); *G01J 1/4204* (2013.01); *G01J 1/4228* (2013.01); *G01J 5/025* (2013.01); *G01J 5/0215* (2013.01); *G01J 5/0265* (2013.01); *G01J 5/045* (2013.01); *G01J 5/0806* (2013.01); *G01S 7/4813* (2013.01); *G01S 17/04* (2020.01); *G06F 1/1656* (2013.01); *H01L 23/552* (2013.01); *H01L 31/101* (2013.01); *H04M 1/0264* (2013.01); *H04M 1/72448* (2021.01); *H04N 5/2257* (2013.01); *H05K 1/18* (2013.01); *H05K 5/0217* (2013.01); *G01J 2001/061* (2013.01); *H01L 25/167* (2013.01); *H05K 2201/10113* (2013.01)

(58) Field of Classification Search
CPC ... G01S 7/481–4818; G01J 5/02–0896; H05K 1/0274; H05K 9/0058; H05K 2201/10106; H05K 2201/10113; H04M 1/026; H04M 1/0264; H04M 1/0266; H04M 1/0268; H04M 1/0269; H04M 1/0272

See application file for complete search history.

(56) References Cited

U.S. PATENT DOCUMENTS

| 2015/0002383 | A1* | 1/2015 | Mankowski | G06F 3/017 345/156 |
| 2016/0146639 | A1 | 5/2016 | Chan | |
| 2016/0204640 | A1 | 7/2016 | Kwak et al. | |
| 2017/0366798 | A1* | 12/2017 | Bae | H04N 5/2258 |
| 2018/0373930 | A1 | 12/2018 | Zhou | |
| 2020/0107436 | A1* | 4/2020 | He | H01L 31/1892 |

FOREIGN PATENT DOCUMENTS

| CN | 103678070 | A | | 3/2014 | |
| CN | 104281254 | A | * | 1/2015 | .......... G06F 1/1694 |
| CN | 204145746 | U | | 2/2015 | |
| CN | 105573563 | A | | 5/2016 | |
| CN | 103515371 | B | | 9/2016 | |
| CN | 106550228 | A | | 3/2017 | |
| CN | 107358175 | A | | 11/2017 | |
| CN | 107392955 | A | * | 11/2017 | ............. G01S 17/08 |
| CN | 206639231 | U | | 11/2017 | |
| CN | 107437065 | A | * | 12/2017 | ............. G06F 21/32 |
| CN | 107451542 | A | | 12/2017 | |
| CN | 107480589 | A | | 12/2017 | |
| CN | 107508938 | A | | 12/2017 | |
| CN | 108063148 | A | | 5/2018 | |
| CN | 108173990 | A | | 6/2018 | |
| CN | 108183983 | A | | 6/2018 | |
| CN | 108183999 | A | | 6/2018 | |
| CN | 108200231 | A | | 6/2018 | |
| CN | 108304038 | A | * | 7/2018 | ........... G06F 1/1626 |
| CN | 108600436 | A | * | 9/2018 | ............ H04M 1/026 |

OTHER PUBLICATIONS

Second Office Action of the Chinese application No. 201711437455.X, dated Sep. 30, 2019.
Second Office Action of the Chinese application No. 201711433084.8, dated Sep. 23, 2019.
Second Office Action of the Chinese application No. 201711433116.4, dated Oct. 8, 2019.
Second Office Action of the Chinese application No. 201711437245.0, dated Dec. 4, 2019.
European Search Report in the European application No. 18215188.6, dated Jun. 21, 2019.
First Office Action and Search Report of the Chinese application No. 201711437455.X, dated Apr. 24, 2019.
First Office Action and Search Report of the Chinese application No. 201711437255.4, dated May 17, 2019.
First Office Action and Search Report of the Chinese application No. 201711433084.8, dated Apr. 22, 2019.
First Office Action and Search Report of the Chinese application No. 201711433116.4, dated May 7, 2019.
First Office Action and Search Report of the Chinese application No. 201711437245.0, dated Jun. 18, 2019.
International Search Report in international application No. PCT/CN2018/123390, dated Feb. 27, 2019.
Written Opinion of the International Search Authority in international application No. PCT/CN2018/123390, dated Feb. 27, 2019.

\* cited by examiner (a)

(b)

ELECTRONIC DEVICE

CROSS-REFERENCE TO RELATED APPLICATIONS

The present disclosure claims benefit of and priority to Chinese Application Numbers 201711437455.X, 201711437255.4, 201711433084.8, 201711433116.4, and 201711437245.0, all filed on Dec. 26, 2017, the contents of which are hereby incorporated by reference in their entireties.

TECHNICAL FIELD

The present disclosure relates to the technical field of consumer electronics, and more particularly to an electronic device.

BACKGROUND

Along with increasing enrichment and diversification of functions supported by a mobile phone, types and number of functional elements required to be arranged in the mobile phone also increase. For realizing functions of distance detection, ambient light detection, 3-Dimensional (3D) face recognition of a user and the like, functional elements such as a proximity sensor, an ambient light sensor, an infrared camera and a structured light projector are required to be arranged in an electronic device. Therefore, a space of the mobile phone may be occupied excessively to arrange numerous functional elements.

BRIEF DESCRIPTION OF DRAWINGS

The abovementioned and/or additional aspects and advantages of the present disclosure will become apparent and easy to understand from the descriptions made to the embodiments below in combination with the drawings.

DETAILED DESCRIPTION

Figure 1:
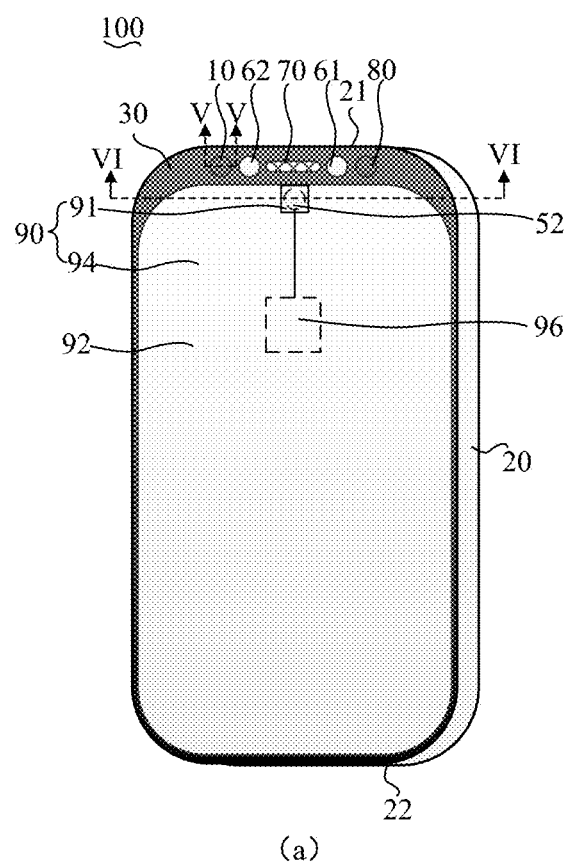
FIG. 1 is a structure diagram illustrating an electronic device according to an embodiment of the present disclosure.
Figure 1:
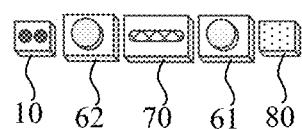

The embodiments of the present disclosure will further be described below in combination with the drawings. The same or similar reference signs in the drawings always represent the same or similar components/elements or components/elements with the same or similar functions.

In addition, the embodiments of the present disclosure described below in combination with the drawings are exemplary and only adopted to explain the embodiments of the present disclosure and should not be understood as limits to the present disclosure.

In the present disclosure, unless otherwise specified and limited definitely, the state that a first feature is "above" or "below" a second feature may refer to that the first and second features directly contact or the first and second features indirectly contact through a medium. Moreover, the state that the first feature is "above", "over" and "on" the second feature may refer to that the first feature is over or above the second feature or only represents that a horizontal height of the first feature is greater than that of the second feature. The state that the first feature is "below", "under" and "beneath" the second feature may refer to that the first feature is under or below the second feature or only represents that the horizontal height of the first feature is smaller/less than that of the second feature.

The present disclosure relates to an electronic device, which includes:

an enclosure;

an output component, wherein the output component is mounted on the enclosure, and the output component includes a packaging shell, an infrared supplementary lighting lamp and a proximity infrared lamp; the packaging shell includes a packaging substrate; the infrared supplementary lighting lamp and the proximity infrared lamp are packaged in the packaging shell and born on the packaging substrate; and the infrared supplementary lighting lamp and the proximity infrared lamp are capable of emitting infrared light out of the packaging shell with different power;

a display screen, wherein the display screen is arranged on the enclosure, and the display screen is provided with a non-opaque entity region and includes a front surface capable of displaying a picture and a back surface back on to the front surface; and an optical sensor, wherein the optical sensor is arranged on a side, where the back surface is positioned, of the display screen; the optical sensor corresponds to the non-opaque entity region, and the optical sensor is arranged to receive light incident onto the optical sensor and output a target light intensity of the light.

In at least one embodiment, the electronic device may further include a main board, an imaging component and a proximity sensor; wherein the main board may be mounted in the enclosure and provided with a mounting notch; the imaging component may be mounted in the enclosure and correspond to the mounting notch; the proximity sensor may be connected to the main board and extend into the mounting notch from an edge of the mounting notch; and the proximity sensor may be partially overlapped with the imaging component in a depth direction of the mounting notch.

In at least one embodiment, the electronic device may further include an imaging component and a proximity sensor; wherein the imaging component may be mounted on the enclosure, and the proximity sensor may be mounted on the imaging component.

In at least one embodiment, the imaging component may include a camera shell and a lens component; a top surface of the camera shell may be a stepped surface and may include a first top subsurface and a second top subsurface which is connected with the first top subsurface; the second top subsurface may be inclined relative to the first top subsurface and form a cut with the first top subsurface; the top surface may be provided with a light output through hole, and the lens component may be accommodated in the camera shell and correspond to the light output through hole; and the proximity sensor may be arranged at the first top subsurface.

In at least one embodiment, the imaging component may include a camera shell and two lens components, and a cut may be formed in a top surface of the camera shell to form a stepped top surface; the top surface may include a first stepped surface and a second stepped surface at a level lower than that of the first stepped surface, two light output through holes may be formed in the first stepped surface, and the light output through holes may correspond to the lens components; and the proximity sensor may be arranged at the second stepped surface.

In at least one embodiment, the imaging component may include a lens mount, a lens barrel mounted on the lens mount and a substrate partially arranged in the lens mount; and the proximity sensor may be arranged on the substrate.

In at least one embodiment, the electronic device may further include a proximity sensor, and the proximity sensor may be combined with the output component; the infrared supplementary lighting lamp, the proximity infrared lamp and the proximity sensor may be all packaged in the packaging shell and born on the packaging substrate; and the proximity sensor may be arranged to receive the infrared light reflected by an object to detect a distance between the object and the electronic device.

In at least one embodiment, the output component may further include a chip, and the infrared supplementary lighting lamp and the proximity infrared lamp may be formed on the same chip.

In at least one embodiment, the packaging shell may further include a packaging sidewall and a packaging top; the packaging sidewall may extend from the packaging substrate and may be connected between the packaging top and the packaging substrate; a supplementary lighting window and a proximity window may be formed in the packaging top, the supplementary lighting window may correspond to the infrared supplementary lighting lamp, and the proximity window may correspond to the proximity infrared lamp.

In at least one embodiment, the output component may further include at least one of a supplementary lighting lamp lens or a proximity lamp lens; the supplementary lighting lamp lens may be arranged in the packaging shell and correspond to the infrared supplementary lighting lamp; and the proximity lamp lens may be arranged in the packaging shell and correspond to the proximity infrared lamp.

In at least one embodiment, the output component may further include a metal baffle plate, and the metal baffle plate may be positioned in the packaging shell and positioned between the infrared supplementary lighting lamp and the proximity infrared lamp.

In at least one embodiment, the output component may further include an optical sealing cover made from a non-opaque material; the optical sealing cover may be formed on the packaging substrate and positioned in the packaging shell, and the optical sealing cover may wrap the infrared supplementary lighting lamp and the proximity infrared lamp.

In at least one embodiment, the output component may further include a light output baffle plate, and the light output baffle plate may be formed in the optical sealing cover and positioned between the infrared supplementary lighting lamp and the proximity infrared lamp.

In at least one embodiment, the electronic device may further include a non-opaque cover plate, wherein the enclosure may be provided with an enclosure proximity through hole and an enclosure supplementary lighting through hole; the proximity infrared lamp may correspond to the enclosure proximity through hole, the infrared supplementary lighting lamp may correspond to the enclosure supplementary lighting through hole, and the cover plate may be arranged on the enclosure.

In at least one embodiment, the output component may further include a chip; and the infrared supplementary lighting lamp, the proximity infrared lamp and the proximity sensor may be all formed on the same chip.

In at least one embodiment, the packaging shell may further include a packaging sidewall and a packaging top; the packaging sidewall may extend from the packaging substrate and may be connected between the packaging top and the packaging substrate; a supplementary lighting window, a proximity window and a proximity light receiving window may be formed in the packaging top; the supplementary lighting window may correspond to the infrared supplementary lighting lamp, the proximity window may correspond to the proximity infrared lamp, and the proximity light receiving window may correspond to the proximity sensor.

In at least one embodiment, the output component may further include at least one of a supplementary lighting lamp lens, a proximity lamp lens or a proximity sensing lens; the supplementary lighting lamp lens may be arranged in the packaging shell and correspond to the infrared supplementary lighting lamp; the proximity lamp lens may be arranged in the packaging shell and correspond to the proximity infrared lamp; and the proximity sensing lens may be arranged in the packaging shell and correspond to the proximity sensor.

In at least one embodiment, the output component may further include multiple metal baffle plates, and the multiple metal baffle plates may be positioned in the packaging shell and positioned between any two of the infrared supplementary lighting lamp, the proximity infrared lamp and the proximity sensor respectively.

In at least one embodiment, the output component may further include an optical sealing cover made from a non-opaque material; the optical sealing cover may be formed on the packaging substrate and positioned in the packaging shell, and the optical sealing cover may wrap the infrared supplementary lighting lamp, the proximity infrared lamp and the proximity sensor.

In at least one embodiment, the output component may further include multiple light output baffle plates, and the multiple light output baffle plates may be formed in the optical sealing cover and positioned between any two of the infrared supplementary lighting lamp, the proximity infrared lamp and the proximity sensor respectively.

In at least one embodiment, the electronic device may further include a non-opaque cover plate, wherein the enclosure may be provided with an enclosure proximity through hole, an enclosure supplementary lighting through hole and an enclosure proximity light receiving through hole; the proximity infrared lamp may correspond to the enclosure proximity through hole, the infrared supplementary lighting lamp may correspond to the enclosure supplementary lighting through hole, the proximity sensor may correspond to the enclosure proximity light receiving through hole, and the cover plate may be arranged on the enclosure.

The present disclosure relates to an electronic device, which includes an output component, wherein the output component includes a packaging shell, an infrared supplementary lighting lamp and a proximity infrared lamp; the packaging shell includes a packaging substrate; the infrared supplementary lighting lamp and the proximity infrared lamp are packaged in the packaging shell and born on the packaging substrate; and the infrared supplementary lighting lamp and the proximity infrared lamp are capable of emitting infrared light out of the packaging shell with different power.

As illustrated in FIG. 1, an electronic device 100 of an embodiment of the present disclosure includes an enclosure 20, a cover plate 30, a display screen 90 and electronic elements. The electronic elements include an output component 10, a proximity sensor 51 (illustrated in FIG. 7), an optical sensor 52, an imaging component 60 (illustrated in FIG. 7), a receiver 70 and a structured light projector 80. The electronic device 100 may be a mobile phone, a tablet computer, a notebook computer, a smart watch, a smart band, a teller machine and the like. Descriptions will be made in embodiments of the present disclosure with the condition that the electronic device 100 is a mobile phone. It can be understood that another specific form of the electronic device 100 may be adopted and there are no limits made thereto.

Figure 2:
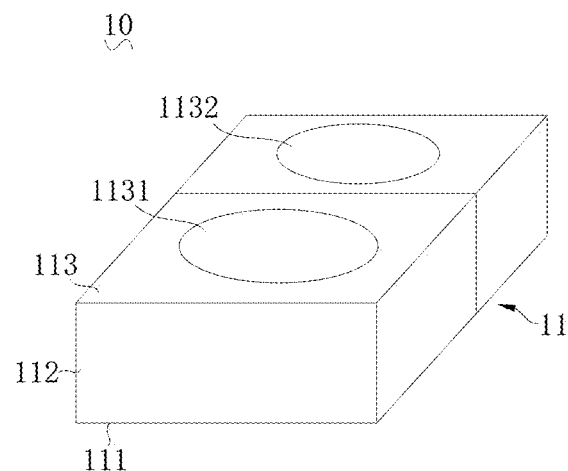
FIG. 2 is a perspective view illustrating an output component of an electronic device according to an embodiment of the present disclosure.
Figure 3:
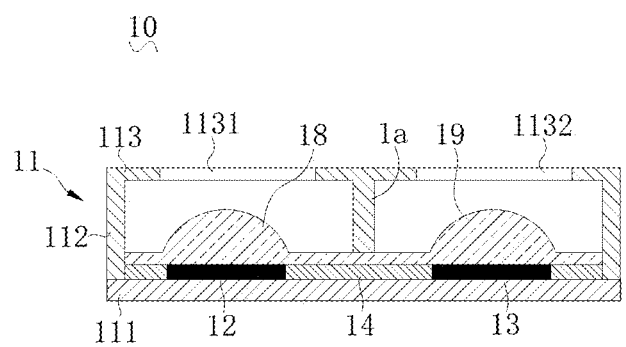
FIG. 3 is a sectional view illustrating an output component of an electronic device according to an embodiment of the present disclosure.

As illustrated in FIG. 2 and FIG. 3, the output component 10 is a single package structure and includes a packaging shell 11, an infrared supplementary lighting lamp 12 and a proximity infrared lamp 13.

The packaging shell 11 is arranged to package/encapsulate both of the infrared supplementary lighting lamp 12 and the proximity infrared lamp 13. In other words, both of the infrared supplementary lighting lamp 12 and the proximity infrared lamp 13 are packaged/encapsulated in the packaging shell 11. The packaging shell 11 includes a packaging substrate 111, a packaging sidewall 112 and a packaging top 113. The packaging shell 11 may be made from an Electromagnetic Interference (EMI) shielding material to avoid influence of external EMI on the output component 10.

The packaging substrate 111 is arranged to bear the infrared supplementary lighting lamp 12 and the proximity infrared lamp 13. When the output component 10 is manufactured, the infrared supplementary lighting lamp 12 and the proximity infrared lamp 13 may be formed on the same chip 14, and then the infrared supplementary lighting lamp 12, the proximity infrared lamp 13 and the chip 14 are arranged on the packaging substrate 111 together. Specifically, the chip 14 may be bonded/adhered to the packaging substrate 111. Meanwhile, the packaging substrate 111 may also be connected with other components of the electronic device 100 (for example, the enclosure 20 and a main board 110 (illustrated in FIG. 21) of the electronic device 100) to fix the output component 10 in the electronic device 100.

The packaging sidewall 112 may be arranged in a manner of surrounding the infrared supplementary lighting lamp 12 and the proximity infrared lamp 13. The packaging sidewall 112 extends from the packaging substrate 111. The packaging sidewall 112 may be connected/combined with the packaging substrate 111. Preferably, the packaging sidewall 112 is detachably connected with the packaging substrate 111 to overhaul the infrared supplementary lighting lamp 12 and the proximity infrared lamp 13 after the packaging sidewall 112 is dismounted. A material of the packaging sidewall 112 may be a material through which infrared light cannot be transmitted, so that the infrared light emitted by the infrared supplementary lighting lamp 12 or the proximity infrared lamp 13 is prevented from penetrating through the packaging sidewall 112.

The packaging top 113 is opposite to the packaging substrate 111. The packaging top 113 is connected with the packaging sidewall 112. A supplementary lighting window 1131 and a proximity window 1132 are formed in the packaging top 113. The supplementary lighting window 1131 corresponds to the infrared supplementary lighting lamp 12, and infrared light emitted by the infrared supplementary lighting lamp 12 penetrates through the supplementary lighting window 1131. The proximity window 1132 corresponds to the proximity infrared lamp 13, and infrared light emitted by the proximity infrared lamp 13 penetrates through the proximity window 1132. The packaging top 113 and the packaging sidewall 112 may be integrally formed and may also be split and formed. In an example, the supplementary lighting window 1131 and the proximity window 1132 are through holes, and the material of the packaging top 113 is the material through which the infrared light cannot be transmitted. In another example, the packaging top 113 is made from both of the material through which the infrared light cannot be transmitted and a material through which the infrared light can be transmitted. Specifically, the supplementary lighting window 1131 and the proximity window 1132 are made from the material through which the infrared light can be transmitted and the other part is made from the material through which the infrared light cannot be transmitted. Furthermore, the supplementary lighting window 1131 and the proximity window 1132 may be provided with lens structures to improve the emission angle of the infrared light emitted from the supplementary lighting window 1131 and the proximity window 1132. For example, the supplementary lighting window 1131 is provided with a concave lens structure to diverge and externally emit the light penetrating through the supplementary lighting window 1131. The proximity window 1132 is provided with a convex lens structure to gather and externally emit the light penetrating through the proximity window 1132.

The infrared supplementary lighting lamp 12 and the proximity infrared lamp 13 may be formed on the same chip 14, so that a size formed after the infrared supplementary lighting lamp 12 and the proximity infrared lamp 13 are integrated is further reduced and a preparation process is relatively simple. The infrared supplementary lighting lamp 12 may emit the infrared light, the infrared light penetrates through the supplementary lighting window 1131 to be projected onto a surface of an object; and an infrared camera 62 (illustrated in FIG. 1) of the electronic device 100 receives the infrared light reflected by the object to acquire image information of the object (in such case, the infrared supplementary lighting lamp 12 is arranged for infrared supplementary lighting). The proximity infrared lamp 13 may emit the infrared light, the infrared light penetrates through the proximity window 1132 and reaches the surface of the object; and a proximity sensor 51 (illustrated in FIG. 7) of the electronic device 100 receives the infrared light reflected by the object to detect a distance between the object and the electronic device 100 (in such case, the proximity infrared lamp 13 is arranged for infrared distance measurement).

Figure 4:
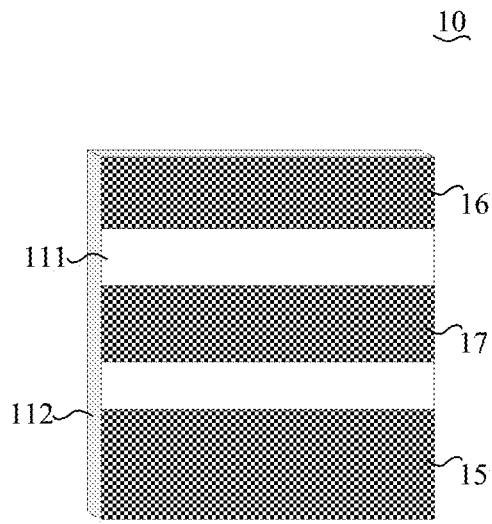
FIG. 4 is a perspective view illustrating an output component of an electronic device according to an embodiment of the present disclosure.

The infrared supplementary lighting lamp 12 and the proximity infrared lamp 13 may emit the infrared light out of the packaging shell 11 with different power. Specifically, the infrared supplementary lighting lamp 12 and the proximity infrared lamp 13 may simultaneously emit the infrared light, and the output component 10 is simultaneously arranged for infrared supplementary lighting and infrared distance measurement. The infrared supplementary lighting lamp 12 may also emit the light, but the proximity infrared lamp 13 does not emit any light, and the output component 10 is only arranged for infrared supplementary lighting. The infrared supplementary lighting lamp 12 may also not emit any light, but the proximity infrared lamp 13 emits the light, and the output component 10 is only arranged for infrared distance measurement. In combination with FIG. 4, in an embodiment of the present disclosure, a grounding pin 15, a supplementary lighting lamp pin 16 and a proximity lamp pin 17 are formed on the output component 10. The grounding pin 15, the supplementary lighting lamp pint 16 and the proximity lamp pin 17 may be formed on the packaging substrate 111. When the grounding pin 15 and the supplementary lighting lamp pin 16 are enabled (that is, the grounding pin 15 and the supplementary lighting lamp pin 16 are connected to a circuit and powered on), the infrared supplementary lighting lamp 12 emits the infrared light. When the grounding pin 15 and the proximity lamp pin 17 are enabled (that is, the grounding pin 15 and the proximity lamp pin 17 are connected to the circuit and powered on), the proximity infrared lamp 13 emits the infrared light.

Figure 5:
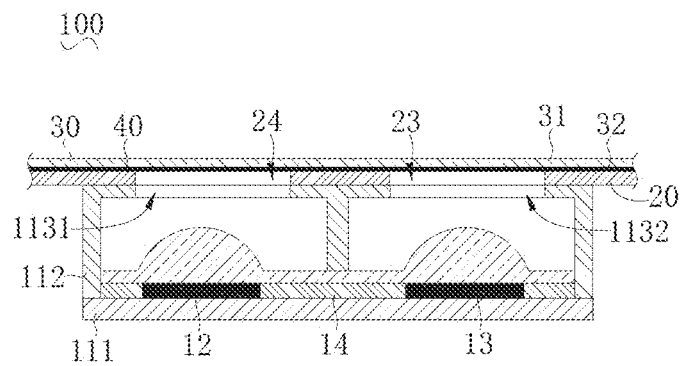
FIG. 5 is a partial sectional view illustrating the electronic device in FIG. 1 along a V-V line.
Figure 6:
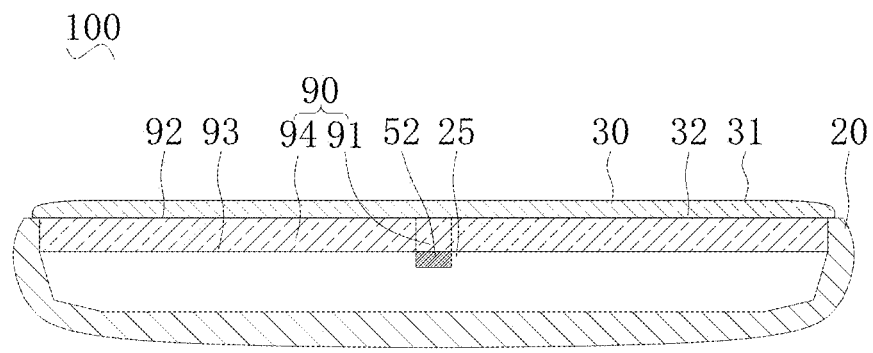
FIG. 6 is a sectional view illustrating the electronic device in FIG. 1 along a VI-VI line.

As illustrated in FIG. 1, FIG. 5 and FIG. 6, the enclosure 20 may be used as a mounting carrier/supporter of the output component 10. In other words, the output component 10 may be arranged in the enclosure 20. The enclosure 20 includes a top 21 and a bottom 22. In a state that a user normally uses the electronic device 100, the top 21 is positioned above the bottom 22, as illustrated in FIG. 1. The output component 10 is arranged between the top 21 and the bottom 22. The enclosure 20 is provided with a mounting groove 25. The mounting groove 25 is formed between the top 21 and the bottom 22. The enclosure 20 may be a middle shell or outer shell of the electronic device 100.

As illustrated in FIG. 6, the display screen 90 is arranged on the enclosure 20 and seals the mounting groove 25 to form a sealed mounting space. The display screen 90 is provided with a non-opaque entity region 91 and an opaque region 94. The non-opaque entity region 91 includes no image pixels and is surrounded by multiple image pixels, and the image pixels are distributed in the opaque region 94. In other words, the opaque region 94 is a display region of the display screen 90 to realize a display function of the display screen 90. A material for the non-opaque entity region 91 includes, but not limited to, glass. The light outside the electronic device 100 may penetrate through the non-opaque entity region 91 and enter the electronic device 100 without damaging integrity of the display screen 90. The display screen 90 includes a front surface 92 capable of displaying a picture and a back surface 93 back on to the front surface 92. Specifically, when the display screen 90 emits light and displays the picture, the light emitted by the display screen 90 is emitted out of the display screen 90 from the front surface 92. When the display screen 90 is mounted on the enclosure 20, the mounting groove 25 and the front surface 92 are positioned on two opposite sides of the back surface 93 (that is, the back surface 93 is positioned between the front surface 92 and the mounting groove 25). In an embodiment of the present disclosure, the output component 10 may be arranged between an edge of the display screen 90 and the top 21. Since the output component 10 in the embodiment of the present disclosure may occupy a relatively small size, a size for arranging the display screen 90 in the enclosure 20 may be correspondingly enlarged to increase a screen-to-body ratio of the electronic device 100. In other embodiment, the display screen 90 may be a full screen/an all screen with a notch, the display screen 90 surrounds the output component 10, and the output component 10 is exposed from the notch of the display screen 90. In at least one embodiment, the non-opaque entity region 91 and the surrounding opaque region 94 are equal in thickness and continuous.

As illustrated in FIG. 1 and FIG. 5, the enclosure 20 is also provided with an enclosure proximity through hole 23 and an enclosure supplementary lighting through hole 24. When the output component 10 is arranged in the enclosure 20, the proximity infrared lamp 13 corresponds to the enclosure proximity through hole 23, and the infrared supplementary lighting lamp 12 corresponds to the enclosure supplementary lighting through hole 24. The condition that the proximity infrared lamp 13 corresponds to the enclosure proximity through hole 23 refers to that the light emitted by the proximity infrared lamp 13 may penetrate through the enclosure proximity through hole 23. Specifically, the proximity infrared lamp 13 may be opposite to the enclosure proximity through hole 23, or the light emitted by the proximity infrared lamp 13 may also penetrate through the enclosure proximity through hole 23 after being subjected to an action of a light guide component. The condition that the infrared supplementary lighting lamp 12 corresponds to the enclosure supplementary lighting through hole 24 is the same as the above and will not be elaborated herein. In the embodiment illustrated in FIG. 5, the enclosure proximity through hole 23 and the enclosure supplementary lighting through hole 24 may be spaced/separated from each other. Of course, in other embodiments, the enclosure proximity through hole 23 and the enclosure supplementary lighting through hole 24 may also be communicated with each other.

The cover plate 30 may be non-opaque, and a material for the cover plate 30 may be non-opaque glass, resin, plastics and the like. The cover plate 30 is arranged on the enclosure 20. The cover plate 30 includes an inner surface 32 connected with the enclosure 20 and an outer surface 31 back on to the inner surface 32. The light emitted by the output component 10 sequentially penetrates through the inner surface 32 and the outer surface 31 and then penetrates through the cover plate 30. In the embodiment illustrated in FIG. 5, the cover plate 30 covers the enclosure supplementary lighting through hole 24 and the enclosure proximity through hole 23, and the inner surface 32 of the cover plate 30 is coated with infrared transmission ink 40. The infrared transmission ink 40 has relatively high transmittance, for example, capable of reaching 85% or above, for the infrared light and has a relatively high attenuation rate, for example, capable of reaching over 70%, for visible light, so that a region covered by the infrared transmission ink 40 on the electronic device 100 is almost invisible for naked eyes of the user during normal use. Specifically, the infrared transmission ink 40 may cover the region not corresponding to the display screen 90 on the inner surface 32.

The infrared transmission ink 40 may also cover at least one of the enclosure proximity through hole 23 or the enclosure supplementary lighting through hole 24. That is, the infrared transmission ink 40 may simultaneously cover the enclosure proximity through hole 23 and the enclosure supplementary lighting through hole 24 (illustrated in FIG. 5). Then the user may hardly see an internal structure of the electronic device 100 through the enclosure proximity through hole 23 and the enclosure supplementary lighting through hole 24, and the electronic device 100 is relatively attractive in appearance. The infrared transmission ink 40 may also cover the enclosure proximity through hole 23 and not cover the enclosure supplementary lighting through hole 24. Or the infrared transmission ink 40 may also cover the enclosure supplementary lighting through hole 24 and not cover the enclosure proximity through hole 23.

As illustrated in FIG. 6, the optical sensor 52 is a single package. The optical sensor 52 is mounted in the mounting groove 25 and positioned on the side, where the back surface 93 is positioned, of the display screen 90. In other words, the optical sensor 52 is positioned below the display screen 90. The optical sensor 52 corresponds to the non-opaque entity region 91. Specifically, the visible light outside the electronic device 100 may penetrate through the non-opaque entity region 91 and be transmitted to the optical sensor 52. The optical sensor 52 receives the visible light in ambient light and detects an intensity of the visible light as a basis for controlling display brightness of the display screen 90. In the embodiment, the optical sensor 52 is mounted in the mounting groove 25 at first, and then the display screen 90 is mounted on the enclosure 20. The optical sensor 52 may contact with or be spaced from the display screen 90. In another embodiment, the optical sensor 52 may be mounted on the display screen 90, the optical sensor 52 corresponds to the non-opaque entity region 91, and then both of the display screen 90 and the optical sensor 52 are mounted on the enclosure 20.

Figure 7:
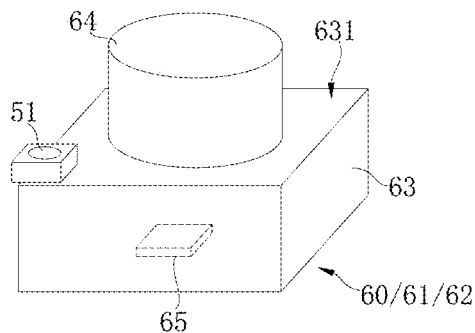
FIG. 7 is a perspective view illustrating a proximity sensor and an imaging component of an electronic device according to an embodiment of the present disclosure.

As illustrated in FIG. 1 and FIG. 7, the proximity sensor 51 is a single package. The infrared light externally emitted by the proximity infrared lamp 13, after being reflected by the external object, is received by the proximity sensor 51; and the proximity sensor 51 determines the distance between the external object and the electronic device 100 according to the received reflected infrared light.

As illustrated in FIG. 1 and FIG. 7, the imaging component 60 may include one or two of a visible light camera 61 and the infrared camera 62. The imaging component 60 includes a lens mount 63, a lens barrel 64 and an image sensor 65. The lens barrel 64 is mounted on the lens mount 63, and the image sensor 65 is accommodated in the lens mount 63. The lens mount 63 includes a mounting surface 631, and the mounting surface 631 is positioned between the lens barrel 64 and the image sensor 65. In the embodiment illustrated in FIG. 7, the proximity sensor 51 is arranged on the mounting surface 631. Specifically, an orthographic projection of the proximity sensor 51 on a plane where the mounting surface 631 is positioned at least partially falls on the mounting surface 631. In such a manner, the proximity sensor 51 and the imaging component 60 are arranged relatively closely, and the transverse space occupied by them is relatively small.

As illustrated in FIG. 1, the receiver 70 is arranged to externally send an acoustic wave signal when being excited by a power supply, and the user may communicate through the receiver 70. The structured light projector 80 is arranged to externally emit structured light, and the structured light is reflected after being projected onto the measured object. The reflected structured light may be received by the infrared camera 62, and a processor of the electronic device 100 further analyzes the structured light received by the infrared camera 62 to obtain depth information of the measured object.

Figure 8:
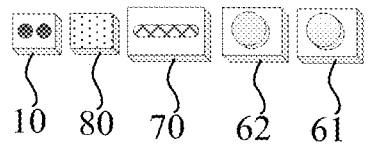
FIG. 8 is an arrangement diagram illustrating electronic elements of an electronic device according to an embodiment of the present disclosure.

In the embodiment illustrated in FIG. 1, the imaging component 60 may include the visible light camera 61 and the infrared camera 62. Centers of the output component 10, the infrared camera 62, the visible light camera 61, the receiver 70 and the structured light project 80 are positioned on the same line segment. Specifically, the output component 10, the structured light projector 80, the receiver 70, the infrared camera 62 and the visible light camera 61 are sequentially arranged from one end to the other end of the line segment (illustrated in FIG. 8). In such case, the visible light camera 61 and the infrared camera 62 may form dual cameras (illustrated in FIGS. 17 and 18). Or, the output component 10, the infrared camera 62, the receiver 70, the visible light camera 61 and the structured light projector 80 are sequentially arranged from one end to the other end of the line segment (illustrated in FIG. 1). Or, the infrared camera 62, the output component 10, the receiver 70, the visible light camera 61 and the structured light projector 80 are sequentially arranged from one end to the other end of the line segment. Or, the infrared camera 62, the visible light camera 61, the receiver 70, the output component 10 and the structured light projector 80 are sequentially arranged from one end to the other end of the line segment. In such case, the visible light camera 61 and the infrared camera 62 may form dual cameras (illustrated in FIGS. 17 and 18). Of course, an arrangement manner for the output component 10, the infrared camera 62, the receiver 70, the visible light camera 61 and the structured light project 80 is not limited to the above examples and another manner may also be adopted. For example, the centers of each electronic element are arranged into an arc, or the centers are arranged into a shape such as a rectangle and the like.

Furthermore, in combination with FIG. 7, the proximity sensor 51 may be arranged on the mounting surface 631 of the infrared camera 62, and may also be arranged on the mounting surface 631 of the visible light camera 61. Of course, the proximity sensor 51 may also not be arranged on mounting surface 631. The proximity sensor 51 may be adjacent to the output component 10 and may easily receive the infrared light which is emitted by the proximity infrared lamp 13 and reflected by the external object. The proximity sensor 51 may also be adjacent to the receiver 70 and may easily detect, when the user answers the phone, that an ear of the user gets close to the receiver 70.

In conclusion, in the electronic device 100 of the embodiments of the present disclosure, the output component 10 integrates the infrared supplementary lighting lamp 12 and the proximity infrared lamp 13 into a single package structure, and functions of emitting the infrared light for infrared distance measurement and infrared supplementary lighting are integrated, so that the output component 10 is relatively high in integration level and relatively small in size, and a space for realizing the infrared supplementary lighting and infrared distance measurement functions is saved by the output component 10. In addition, the infrared supplementary lighting lamp 12 and the proximity infrared lamp 13 are born on the same packaging substrate 111, which, compared with a conventional process of adopting different wafers to manufacture the infrared supplementary lighting lamp 12 and the proximity infrared lamp 13 respectively and then combining them onto a PCB substrate, improves packaging efficiency. Meanwhile, the optical sensor 52 is arranged on the side, where the back surface 93 is positioned, of the display screen 90 (below the display screen 90), so that a space between an edge of the display screen 90 and an edge of the enclosure 20 may be prevented from being occupied by the optical sensor 52, and a gap between the edge of the display screen 90 and the edge of the enclosure 20 may be reduced more. That is, the display region of the display screen 90 may be enlarged to increase a screen-to-body ratio of the electronic device 100.

As illustrated in FIG. 3, in at least one embodiment, the output component 10 further includes a supplementary lighting lamp lens 18 and a proximity lamp lens 19. The supplementary lighting lamp lens 18 is arranged in the packaging shell 11 and corresponds to the infrared supplementary lighting lamp 12. The proximity lamp lens 19 is arranged in the packaging shell 11 and corresponds to the proximity infrared lamp 13. The infrared light emitted by the infrared supplementary lighting lamp 12 is gathered under an action of the supplementary lighting lamp lens 18 in the supplementary lighting window 1131 and then emitted, so as to reduce the amount of light emitted to other regions of the packaging sidewall 112 and the packaging top 113. Similarly, the infrared light emitted by the proximity infrared lamp 13 is gathered under an action of the proximity lamp lens 19 in the proximity window 1132 and then emitted, so as to reduce the amount of the light emitted to the other regions of the packaging sidewall 112 and the packaging top 113. Specifically, the supplementary lighting lamp lens 18 and the proximity lamp lens 19 may be positioned on the same transparent substrate. More specifically, the supplementary lighting lamp lens 18 and the proximity lamp lens 19 may be integrally formed with the transparent substrate. Of course, the output component 10 may also be provided with only one of the supplementary lighting lamp lens 18 and the proximity lamp lens 19, and may also not be provided with the supplementary lighting lamp lens 18 and the proximity lamp lens 19.

As illustrated in FIG. 3, in at least one embodiment, the output component 10 further includes a metal baffle plate 1a. The metal baffle plate 1a is positioned in the packaging shell 11, and the metal baffle plate 1a is positioned between the infrared supplementary lighting lamp 12 and the proximity infrared lamp 13. When the metal baffle plate 1a is positioned between the infrared supplementary lighting lamp 12 and the proximity infrared lamp 13, on the one hand, the metal baffle plate 1a may shield EMI between the infrared supplementary lighting lamp 12 and the proximity infrared lamp 13 and avoid mutual influence of luminous intensities and time sequences of the infrared supplementary lighting lamp 12 and the proximity infrared lamp 13, and on the other hand, the metal baffle plate 1a may be arranged to isolate a cavity where the infrared supplementary lighting lamp 12 is positioned from a cavity where the proximity infrared lamp 13 is positioned, and then the light is unlikely to enter the other cavity from one cavity.

Figure 9:
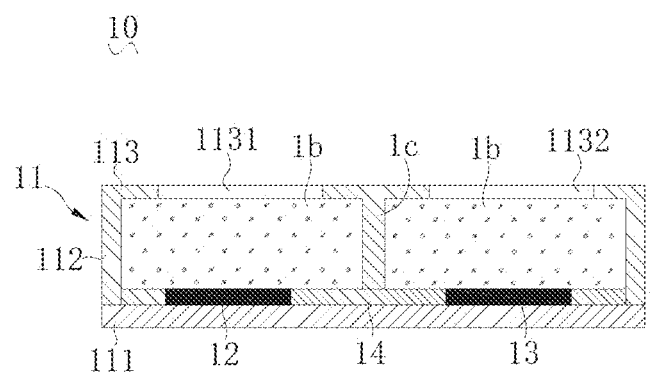
FIG. 9 is a sectional view illustrating an output component of an electronic device according to an embodiment of the present disclosure.

As illustrated in FIG. 9, in at least one embodiment, the output component 10 further includes an optical sealing cover 1b. The optical sealing cover 1b is made from a non-opaque material, and the optical sealing cover 1b is formed on the packaging substrate 111 and positioned in the packaging shell 11. The optical sealing cover 1b wraps/encases the infrared supplementary lighting lamp 12 and the proximity infrared lamp 13. Specifically, the optical sealing cover 1b may be formed by a glue feed injection molding/gel-casting process, and the optical sealing cover 1b may be made from a transparent thermosetting epoxy resin and thus is unlikely to soften during use. The optical sealing cover 1b may fix a relative position between the infrared supplementary lighting lamp 12 and the proximity infrared lamp 13, so that the infrared supplementary lighting lamp 12 and the proximity infrared lamp 13 are not easily shaken/swayed in the packaging shell 11.

In addition, as illustrated in FIG. 9, the output component 10 further includes a light output baffle plate 1c, and the light output baffle plate 1c is formed in the optical sealing cover 1b and positioned between the infrared supplementary lighting lamp 12 and the proximity infrared lamp 13. The light output baffle plate 1c may be arranged to space/separate the infrared supplementary lighting lamp 12 from the proximity infrared lamp 13, so as to ensure that the light emitted by the infrared supplementary lighting lamp 12 cannot penetrate through the proximity window 1132, and the light emitted by the proximity infrared lamp 13 cannot penetrate through the supplementary lighting window 1131.

As illustrated in FIG. 1 and FIG. 6, in at least one embodiment, the non-opaque entity region 91 includes image pixels, the electronic device 100 further includes a processor 96, and the optical sensor 52 receives the light incident onto the optical sensor 52 to output an initial light intensity including ambient light intensity information outside the electronic device 100. The processor 96 is arranged to process the initial light intensity to obtain a target light intensity only including the ambient light intensity information outside the electronic device 100. The processor 96 is mounted on the main board 110. In at least one embodiment, the processor 96 may also process the structured light received by the infrared camera 62 in the abovementioned embodiment.

Specifically, the non-opaque entity region 91 includes the image pixels. The non-opaque entity region 91 may be arranged to display image information and, meanwhile, ambient light may penetrate through the non-opaque entity region 91 and enter the electronic device 100. In at least one embodiment, transmittance of the non-opaque entity region 91 may be more/greater than or equal to 50%. It can be understood that the light incident onto the optical sensor 52 not only includes part of the ambient light penetrating through the non-opaque entity region 91 but also includes part of display light emitted into the electronic device by the image pixels of the non-opaque entity region 91 when a content is displayed. The processor 96 may determine the display light received by the optical sensor 52 and emitted to the optical sensor 52 from the non-opaque entity region 91 according to the content displayed by the non-opaque entity region 91, and thus the processor 96 may determine the target light intensity only including the ambient light intensity information outside the electronic device 100 according to both of the initial light intensity and a light intensity generated by the display light received by the optical sensor 52. The electronic device 100 of the embodiment may obtain the ambient light intensity information outside the electronic device 100 as the basis for controlling the display brightness of the display screen 90.

As illustrated in FIG. 1 and FIG. 6, in at least one embodiment, the initial light intensity includes the ambient light intensity information and display light intensity information received by the optical sensor 52 when the display screen 90 displays an image. The processor 96 is arranged to acquire the display light intensity information received by the optical sensor 52 when the display screen 90 displays the image in real time and, when processing the initial light intensity, to eliminate the display light intensity information to obtain the target light intensity.

Figure 10:
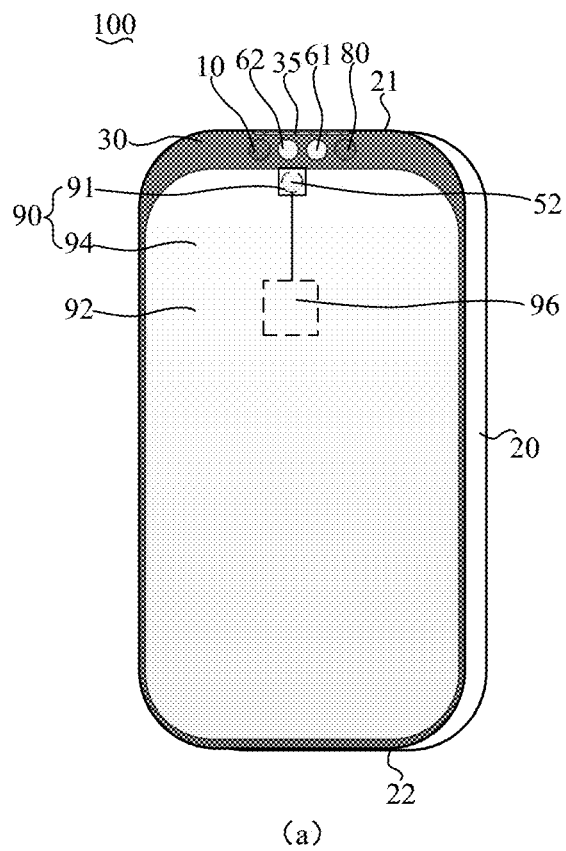
FIG. 10 is a structure diagram illustrating an electronic device according to an embodiment of the present disclosure.
Figure 10:
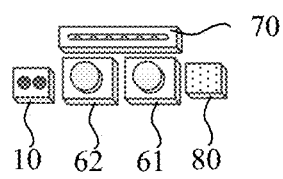

As illustrated in FIG. 10, in at least one embodiment, the enclosure 20 is also provided with an enclosure sound output hole (not illustrated in the figure), the cover plate 30 is also provided with a cover plate sound output hole 35, and the receiver 70 corresponds to positions of the cover plate sound output hole 35 and the enclosure sound output hole. The centers of the output component 10, the infrared camera 62, the visible light camera 61 and the structured light projector 80 are positioned on the same line segment, and the receiver 70 is positioned between the line segment and the top 21 of the enclosure 20.

The center of the receiver 70 is not positioned on the line segment, so that a transverse space occupied by each electronic element (the output component 10, the infrared camera 62, the visible light camera 61, the structured light projector 80 and the like) on the cover plate 30 is saved. In the embodiment illustrated in FIG. 10, the cover plate sound output hole 35 is formed in an edge position of the cover plate 30, and the enclosure sound output hole is formed close to the top 21.

Figure 11:
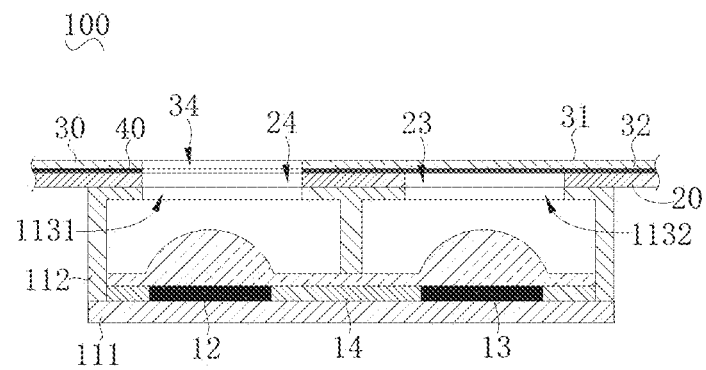
FIG. 11 is a partial sectional view illustrating an electronic device along a position corresponding to the V-V line in FIG. 1 according to an embodiment of the present disclosure.

As illustrated in FIG. 11, in at least one embodiment, a cover plate supplementary lighting through hole 34 may also be formed in the cover plate 30, and the cover plate supplementary lighting through hole 34 corresponds to the enclosure supplementary lighting through hole 24. The infrared light emitted by the infrared supplementary lighting lamp 12, after penetrating through the enclosure supplementary lighting through hole 24, may penetrate through the electronic device 100 from the cover plate supplementary lighting through hole 34. In such case, the infrared transmission ink 40 may be arranged at a position corresponding to the enclosure proximity through hole 23 on the cover plate 30. Then, the user is unlikely to see the proximity infrared lamp 13 in the electronic device 100 through the enclosure proximity through hole 23, and the electronic device 100 is relatively attractive in appearance.

Figure 12:
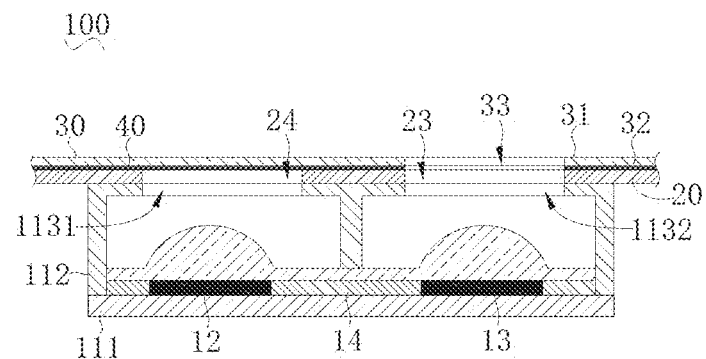
FIG. 12 is a partial sectional view illustrating an electronic device along a position corresponding to the V-V line in FIG. 1 according to another embodiment of the present disclosure.

As illustrated in FIG. 12, in at least one embodiment, a cover plate proximity through hole 33 may also be formed in the cover plate 30, and the cover plate proximity through hole 33 corresponds to the enclosure proximity through hole 23. The infrared light emitted by the proximity infrared lamp 13, after penetrating through the enclosure proximity through hole 23, may penetrate through the electronic device 100 from the cover plate proximity through hole 33. In such case, the infrared transmission ink 40 may be arranged at a position corresponding to the enclosure supplementary lighting through hole 24 on the cover plate 30. The user may hardly see the infrared supplementary lighting lamp 12 in the electronic device 100 through the enclosure supplementary lighting through hole 24, and the electronic device 100 is relatively attractive in appearance.

Figure 13:
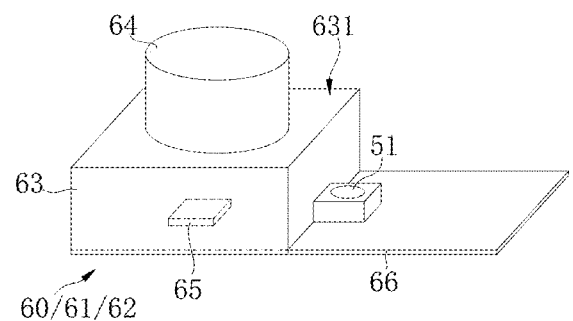
FIG. 13 to FIG. 20 are perspective views illustrating proximity sensors and imaging components of electronic devices according to embodiments of the present disclosure.

As illustrated in FIG. 13, in at least one embodiment, the imaging component 60 further includes a substrate 66, the image sensor 65 is arranged on the substrate 66, and the proximity sensor 51 may also be fixed on the substrate 66. Specifically, a Flexible Printed Circuit (FPC) is arranged on the substrate 66. Part of the substrate 66 is positioned in the lens mount 63, and the other part extends from the lens mount 63. One end of the FPC is positioned in the lens mount 63 and arranged to bear the image sensor 65, and the other end may be connected with the main board 110 of the electronic device 100. When the proximity sensor 51 is arranged on the substrate 66, the proximity sensor 51 is arranged outside the lens mount 63, and the proximity sensor 51 may also be connected with the FPC.

The imaging component 60 may include one or two of the visible light camera 61 and the infrared camera 62. Specifically, the proximity sensor 51 may be fixed on the substrate 66 of the visible light camera 61. Or, the proximity sensor 51 may be fixed on the substrate 66 of the infrared camera 62.

Furthermore, the substrate 66 further includes a reinforcement plate. The reinforcement plate is arranged on the side back on to the proximity sensor 51, so that overall strength of the substrate 66 is strengthened, the FPC is unlikely to fold and, meanwhile, the proximity sensor 51 is unlikely to sway when being arranged on the substrate 66. In an example, the proximity sensor 51 may also be fixed on an outer sidewall of the lens mount 63 and, for example, is fixed on the outer sidewall of the lens mount 63 in a bonding/adhering manner.

Figure 14:
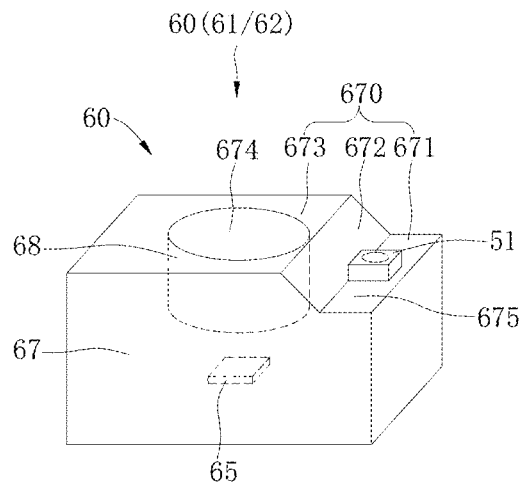

As illustrated in FIG. 14, in at least one embodiment, the electronic device 100 and the imaging component 60 of the embodiments may be replaced with the following structure: the imaging component 60 includes the image sensor 65, a camera shell 67 and a lens component 68. A top surface 670 of the camera shell 67 is a stepped surface. That is, the cross-sectional area of a part of the top surface 670 in the length direction is stepped. Specifically, the top surface 670 includes a first top subsurface 671, a second top subsurface 672 and a third top subsurface 673. The second top subsurface 672 is obliquely connected with the first top subsurface 671 and forms a cut 675 with the first top subsurface 671. The third top subsurface 673 is obliquely connected with the second top subsurface 672. The second top subsurface 672 is positioned between the first top subsurface 671 and the third top subsurface 673 to connect the first top subsurface 671 with the third top subsurface 673. An included angle between the second top subsurface 672 and the first top subsurface 671 may be an obtuse angle or a right angle. An included angle between the second top subsurface 672 and the third top subsurface 673 may be an obtuse angle or a right angle. The cut 675 is formed in one end part of the camera shell 67. That is, the cut 675 is at an edge position of the top surface 670. The third top subsurface 673 is provided with a light output through hole 674. The lens component 68 is accommodated in the camera shell 67 and corresponds to the light output through hole 674. The image sensor 65 is accommodated in the camera shell 67 and corresponds to the lens component 68. The light outside the electronic device 100 may penetrate through the light output through hole 674 and the lens component 68 and is transmitted onto the image sensor 65, and the image sensor 65 converts an optical signal into an electric signal. The proximity sensor 51 is arranged at the first top subsurface 671. In the embodiment, the imaging component 60 may be the visible light camera 61. In other embodiments, the imaging component 60 may be the infrared camera 62.

The imaging component 60 of the embodiment is provided with the cut 675, and the proximity sensor 51 is arranged on the first top subsurface 671, so that the proximity sensor 51 and the imaging component 60 are arranged relatively closely, the transverse space occupied by them is relatively small, and an internal mounting space of the electronic device 100 is saved.

As illustrated in FIG. 14, in at least one embodiment, the proximity sensor 51 of the abovementioned embodiment is arranged on the first top subsurface 671 and positioned outside the camera shell 67. Specifically, a projection of the whole proximity sensor 51 perpendicular to the first top subsurface 671 may be positioned in the first top subsurface 671 (illustrated in FIG. 14). Or, a projection of part of the proximity sensor 51 perpendicular to the first top subsurface 671 is positioned in the first top subsurface 671. That is, the proximity sensor 51 is at least partially positioned over the first top subsurface 671. Therefore, the proximity sensor 51 and the imaging component 60 are arranged relatively closely, the transverse space occupied by them is relatively small, and the internal mounting space of the electronic device 100 is further saved.

Figure 15:
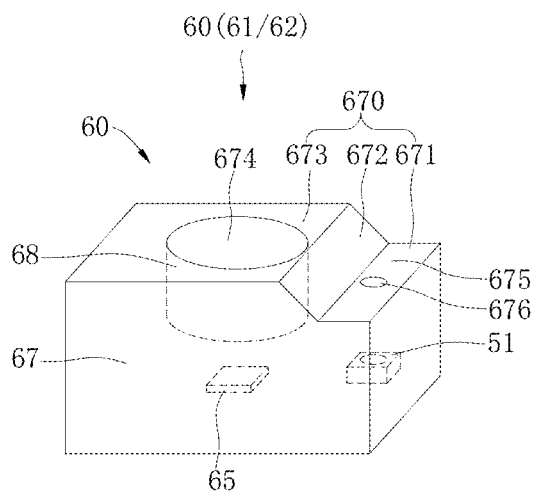

As illustrated in FIG. 15, the first top subsurface 671 of the abovementioned embodiment is provided with a light hole 676, and the proximity sensor 51 is positioned in the camera shell 67 and corresponds to the light hole 676. The light outside the electronic device 100 may penetrate through the light hole 676 and is transmitted onto the proximity sensor 51. The proximity sensor 51 of the embodiment is arranged in the camera shell 67, so that structures of the proximity sensor 51 and the camera shell 67 are more stable, and the proximity sensor 51 and the imaging component 60 may be conveniently mounted on the enclosure 20.

Figure 16:
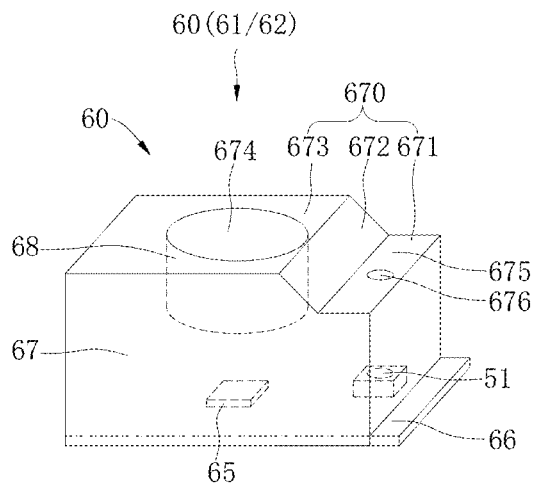

As illustrated in FIG. 16, in at least one embodiment, the first top subsurface 671 of the abovementioned embodiment is provided with the light hole 676, and the proximity sensor 51 is positioned in the camera shell 67 and corresponds to the light hole 676. The imaging component 60 further includes the substrate 66, the image sensor 65 is arranged on the substrate 66, and the proximity sensor 51 may also be fixed on the substrate 66 and accommodated in the camera shell 67. Specifically, the FPC is arranged on the substrate 66. One end of the FPC is positioned in the camera shell 67 and arranged to bear the image sensor 65, and the other end may be connected with the main board 110 of the electronic device 100. In other embodiment, the proximity sensor 51 may also be connected with the FPC.

In the embodiment, the proximity sensor 51 is arranged in the camera shell 67, so that the structures of the proximity sensor 51 and the camera shell 67 are more stable, and the proximity sensor 51 and the imaging component 60 may be conveniently mounted on the enclosure 20. In addition, the imaging component 60 is provided with the substrate 66, and the proximity sensor 51 is arranged on the substrate 66, so that the proximity sensor 51 may be stably mounted in the camera shell 67.

Figure 17:
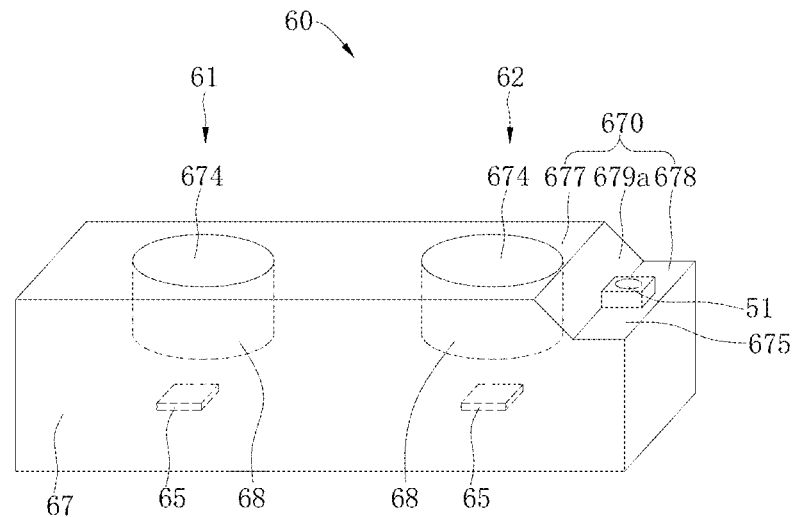

As illustrated in FIG. 17, in at least one embodiment, the electronic device 100 and the imaging component 60 of the abovementioned embodiments may be replaced with the following structure: the imaging component 60 is a dual-camera component and includes two image sensors 65, the camera shell 67 and two lens components 68. The top surface 670 of the camera shell 67 is a stepped surface. The top surface 670 includes a first stepped surface 677, a second stepped surface 678 lower than the first stepped surface 677 and a first connecting surface 679a. The first connecting surface 679a is obliquely connected with the second stepped surface 678 and forms the cut 675 with the second stepped surface 678. The first connecting surface 679a is obliquely connected with the first stepped surface 677. The first connecting surface 679a is positioned between the first stepped surface 677 and the second stepped surface 678 to connect the first stepped surface 677 with the second stepped surface 678. An included angle between the first connecting surface 679a and the first stepped surface 677 may be an obtuse angle or a right angle. An included angle between the first connecting surface 679a and the second stepped surface 678 may be an obtuse angle or a right angle. The cut 675 is formed in one end part of the camera shell 67. That is, the cut 675 is at the edge position of the top surface 670. Two light output through holes 674 are both formed in the first stepped surface 677 and positioned on the same side of the cut 675. A connecting line of centers of the two light output through holes 674 is perpendicular to an extending direction of the cut 675. The two lens components 68 are both accommodated in the camera shell 67 and correspond to the two light output through holes 674 respectively. The light outside the electronic device 100 may penetrate through the light output through holes 674 and the lens components 68 and is transmitted onto the image sensors 65. In the embodiment, the imaging component 60 may be the visible light camera 61 and, in such case, the two lens components 68 are both lens components corresponding to the visible light camera 61. The proximity sensor 51 is arranged on the second stepped surface 678 and positioned outside the camera shell 67. In other embodiment, the imaging component 60 may be the infrared camera 62 and, in such case, the two lens components 68 are both lens components corresponding to the infrared camera 62. In another embodiment, the imaging component 60 includes the visible light camera 61 and the infrared camera 62 and, in such case, one lens component 68 is a lens component corresponding to the infrared camera 62, and the other lens component 68 is a lens component corresponding to the visible light camera 61.

The imaging component 60 of the embodiment is provided with the cut 675, and the proximity sensor 51 is arranged on the second stepped surface 678, so that the proximity sensor 51 and the imaging component 60 are arranged relatively closely, the transverse space occupied by them is relatively small, and the internal mounting space of the electronic device 100 is saved.

Figure 18:
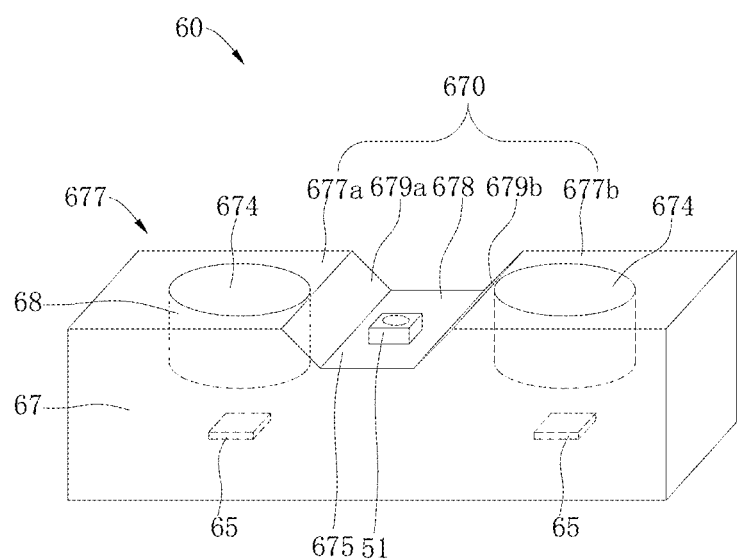

As illustrated in FIG. 18, in at least one embodiment, the cut 675 of the abovementioned embodiment is formed in a middle position of the top surface 670. The first stepped surface 677 is divided into a first stepped subsurface 677a and a second stepped subsurface 677b by the cut 675. The first stepped subsurface 677a and the second stepped subsurface 677b are positioned on two opposite sides of the cut 675 respectively. The two light output through holes 674 are formed in the first stepped subsurface 677a and the second stepped subsurface 677b respectively. The lens components 68 mounted in the camera shell 67 are also positioned on the two opposite sides of the cut 675. In such case, the cut 675 is enclosed by the second stepped surface 678, the first connecting surface 679a and a second connecting surface 679b. The first connecting surface 679a is obliquely connected with the first top subsurface 677a and the second stepped surface 678 and is positioned between the first top subsurface 677a and the second stepped surface 678. The second connecting surface 679b is obliquely connected with the second top subsurface 677b and the second stepped surface 678 and is positioned between the second top subsurface 677b and the second stepped surface 678. In the embodiment, the first stepped surface 677 is parallel to the second stepped surface 678, an included angle between the first connecting surface 679a and the first stepped subsurface 677a is an obtuse angle, and an included angle between the second connecting surface 679b and the second stepped subsurface 677b is an obtuse angle. In other embodiment, the included angle between the first connecting surface 679a and the first stepped subsurface 677a is a right angle, and the included angle between the second connecting surface 679b and the second stepped subsurface 677b is a right angle. Compared with formation of the cut 675 in the edge position of the top surface 670, formation of the cut 675 in the middle position of the top surface 670 in the embodiment may increase a width of the cut 675, thereby facilitating arrangement of the proximity sensor 51 on the second stepped surface 678.

As illustrated in FIG. 17 and FIG. 18, in at least one embodiment, the proximity sensor 51 of the abovementioned embodiment is arranged on the second stepped surface 678 and positioned outside the camera shell 67. Specifically, when the cut 675 is formed in the edge position of the top surface 670, a projection of the whole proximity sensor 51 perpendicular to the second stepped surface 678 may be positioned in the second stepped surface 678 (illustrated in FIG. 17). Or, a projection of part of the proximity sensor 51 perpendicular to the second stepped surface 678 is positioned in the second stepped surface 678. That is, the proximity sensor 51 is at least partially positioned over the second stepped surface 678. When the cut 675 is formed in the middle position of the top surface 670, the projection of the whole proximity sensor 51 perpendicular to the second stepped surface 678 may be positioned in the second stepped surface 678 (illustrated in FIG. 18). Therefore, the proximity sensor 51 and the imaging component 60 are arranged relatively closely, the transverse space occupied by them is relatively small, and the internal mounting space of the electronic device 100 is further saved.

Figure 19:
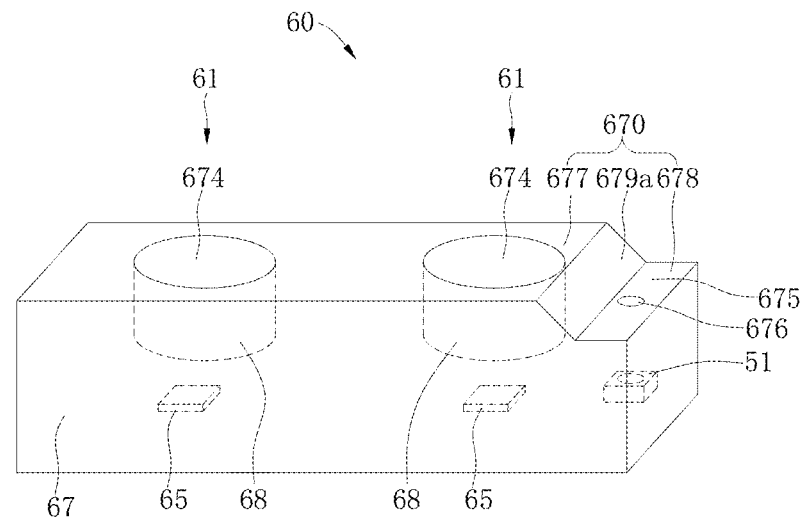

As illustrated in FIG. 19, the second stepped surface 678 of the abovementioned embodiment is provided with the light hole 676, and the proximity sensor 51 is positioned in the camera shell 67 and corresponds to the light hole 676. The light outside the electronic device 100 may penetrate through the light hole 676 and is transmitted onto the proximity sensor 51. The proximity sensor 51 of the embodiment is arranged in the camera shell 67, so that the structures of the proximity sensor 51 and the camera shell 67 are more stable, and the proximity sensor 51 and the imaging component 60 may be conveniently mounted on the enclosure 20.

Figure 20:
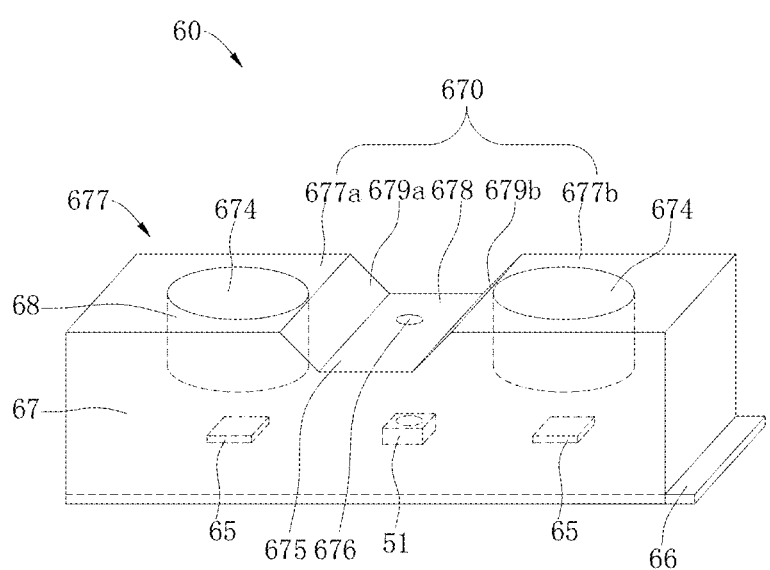

As illustrated in FIG. 20, in at least one embodiment, the second stepped surface 678 of the abovementioned embodiment is provided with the light hole 676, and the proximity sensor 51 is positioned in the camera shell 67 and corresponds to the light hole 676. The imaging component 60 further includes the substrate 66, the image sensor 65 is arranged on the substrate 66, and the proximity sensor 51 may also be fixed on the substrate 66 and accommodated in the camera shell 67. Specifically, the FPC is arranged on the substrate 66. One end of the FPC is positioned in the camera shell 67 and arranged to bear the image sensor 65, and the other end may be connected with the main board 110 of the electronic device 100. In other embodiment, the proximity sensor 51 may also be connected with the FPC.

In the embodiment, the proximity sensor 51 is arranged in the camera shell 67, so that the structures of the proximity sensor 51 and the camera shell 67 are more stable, and the proximity sensor 51 and the imaging component 60 may be conveniently mounted on the enclosure 20. In addition, the imaging component 60 is provided with the substrate 66, and the proximity sensor 51 is arranged on the substrate 66, so that the proximity sensor 51 may be stably mounted in the camera shell 67.

Figure 21:
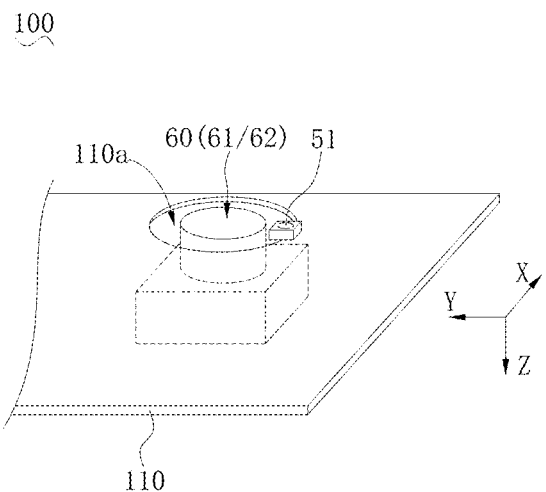
FIG. 21 is a perspective view illustrating a proximity sensor, an imaging component and a main board of an electronic device according to an embodiment of the present disclosure.
Figure 22:
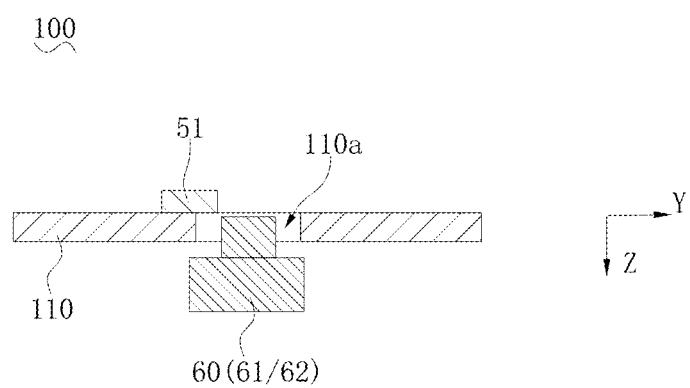
FIG. 22 is a partial sectional view illustrating an electronic device according to an embodiment of the present disclosure.

As illustrated in FIG. 1, FIG. 21 and FIG. 22, in at least one embodiment, the electronic device 100 of the abovementioned embodiment further includes the main board 110 mounted in the enclosure 20. The main board 110 is provided with a mounting notch 110a. The imaging component 60 is mounted in the enclosure 20 and corresponds to the mounting notch 110a. The proximity sensor 51 is connected to the main board 110 and extends into the mounting notch 110a from an edge of the mounting notch 110a. The proximity sensor 51 is partially overlapped with the imaging component 60 in a depth direction (Z direction in FIG. 21) of the mounting notch 110a.

Specifically, the main board 110 may be a printed circuit board (PCB) and the PCB may be a hard board, a flexible board or a flexible and hard board. All of the electronic elements, for example, the output component 10, the proximity sensor 51, the optical sensor 52, the imaging component 60, the receiver 70 and the structured light projector 80, may be connected with the main board 110. The electronic elements may be directly mounted on the main board 110 and may also be mounted on another structure of the electronic device 100 and then connected with the main board 110 through a line. The mounting notch 110a is formed in the main board 110, and the mounting notch 110a may penetrate through the main board 110. The imaging component 60 is mounted in the enclosure 20 and corresponds to the mounting notch 110a. The imaging component 60 may penetrate through the mounting notch 110a. A light input hole (in some embodiments, the light input hole corresponds to the light output through hole 674) of the imaging component 60 may also be aligned with the mounting notch 110a but does not extend into the mounting notch 110a.

The proximity sensor 51 is connected to the main board 110. Specifically, a pin of the proximity sensor 51 may be welded on a bonding pad of the main board 110 to fixedly connect the proximity sensor 51 with the main board 110. The proximity sensor 51 extends into the mounting notch 110a from the edge of the mounting notch 110a, so that a mounting position on the main board 110 is saved. The proximity sensor 51 is partially overlapped with the imaging component 60 in the depth direction (the Z direction in FIG. 22) of the mounting notch 110a. The proximity sensor 51 may contact with the imaging component 60, and the proximity sensor 51 may also be spaced from the imaging component 60. The proximity sensor 51 and the imaging component 60 are arranged relatively closely, the transverse space (in a direction perpendicular to the Z direction) occupied by them is relatively small, and the internal space of the electronic device 100 is saved.

Of course, the imaging component 60 may be the imaging component 60 of the any abovementioned embodiment and transformations thereof and will not be elaborated herein.

Figure 23:
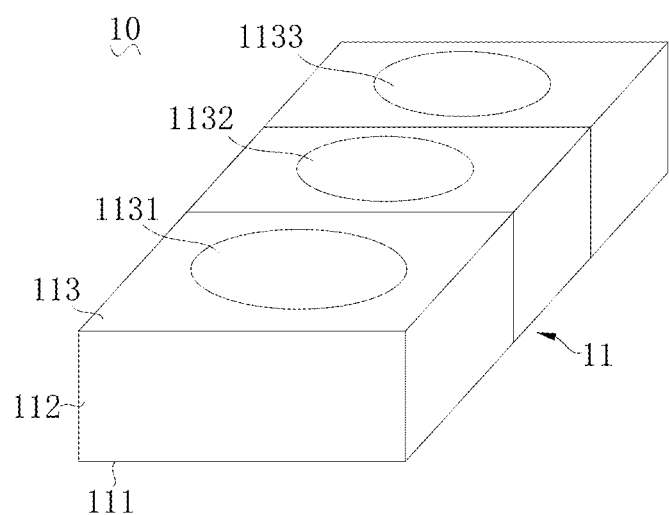
FIG. 23 is a perspective view illustrating an output component of an electronic device according to an embodiment of the present disclosure.
Figure 24:
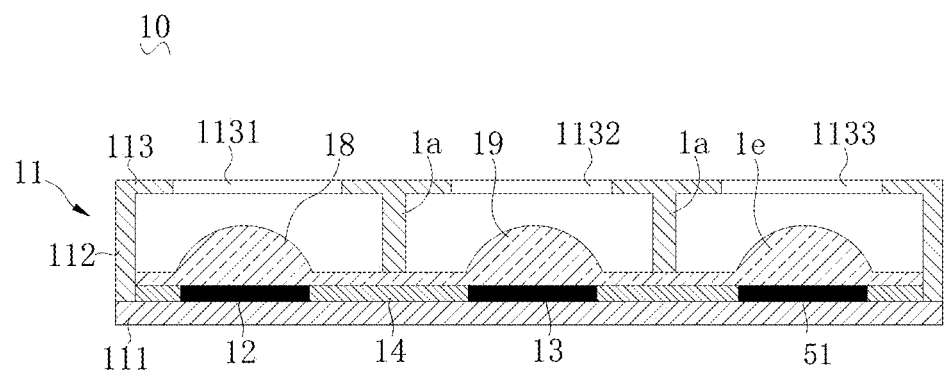
FIG. 24 is a sectional view illustrating an output component of an electronic device according to an embodiment of the present disclosure.

As illustrated in FIG. 23 and FIG. 24, the output component 10 is a single package structure and includes a packaging shell 11, an infrared supplementary lighting lamp 12, a proximity infrared lamp 13 and a proximity sensor 51.

The packaging shell 11 is arranged to package/encapsulate all of the infrared supplementary lighting lamp 12, the proximity infrared lamp 13 and the proximity sensor 51. In other words, all of the infrared supplementary lighting lamp 12, the proximity infrared lamp 13 and the proximity sensor 51 are packaged/encapsulated in the packaging shell 11. The packaging shell 11 includes a packaging substrate 111, a packaging sidewall 112 and a packaging top 113. The packaging shell 11 may be made from an Electromagnetic Interference (EMI) shielding material to avoid influence of external EMI on the output component 10. In the embodiment, centers of the infrared supplementary lighting lamp 12, the proximity infrared lamp 13 and the proximity sensor 51 are positioned on the same line segment. For example, the infrared supplementary lighting lamp 12, the proximity infrared lamp 13 and the proximity sensor 51 are sequentially arranged from one end to the other end of the line segment; or, the proximity infrared lamp 13, the infrared supplementary lighting lamp 12 and the proximity sensor 51 are sequentially arranged from one end to the other end of the line segment; or, the proximity infrared lamp 13, the proximity sensor 51 and the infrared supplementary lighting lamp 12 are sequentially arranged from one end of the other end of the line segment. In other embodiment, a connecting line of the centers of the infrared supplementary lighting lamp 12, the proximity infrared lamp 13 and the proximity sensor 51 forms a triangle.

The packaging substrate 111 is arranged to bear the infrared supplementary lighting lamp 12, the proximity infrared lamp 13 and the proximity sensor 51. When the output component 10 is manufactured, the infrared supplementary lighting lamp 12, the proximity infrared lamp 13 and the proximity sensor 51 may be formed on the same chip 14, and then the infrared supplementary lighting lamp 12, the proximity infrared lamp 13, the proximity sensor 51 and the chip 14 are arranged on the packaging substrate 111 together. Specifically, the chip 14 may be bonded/adhered to the packaging substrate 111. Meanwhile, the packaging substrate 111 may also be connected with other components of the electronic device 100 (for example, the enclosure 20 and a main board of the electronic device 100) to fix the output component 10 in the electronic device 100.

The packaging sidewall 112 may be arranged in a manner of surrounding the infrared supplementary lighting lamp 12, the proximity infrared lamp 13 and the proximity sensor 51. The packaging sidewall 112 extends from the packaging substrate 111. The packaging sidewall 112 may be connected/combined with the packaging substrate 111. Preferably, the packaging sidewall 112 is detachably connected with the packaging substrate 111 to overhaul the infrared supplementary lighting lamp 12, the proximity infrared lamp 13 and the proximity sensor 51 after the packaging sidewall 112 is dismounted. A material of the packaging sidewall 112 may be a material through which infrared light cannot be transmitted, so that the infrared light emitted by the infrared supplementary lighting lamp 12 or the proximity infrared lamp 13 is prevented from penetrating through the packaging sidewall 112.

The packaging top 113 is opposite to the packaging substrate 111. The packaging top 113 is connected with the packaging sidewall 112. The packaging top 113 is provided with a supplementary lighting window 1131, a proximity window 1132 and a proximity light receiving window 1133. The supplementary lighting window 1131 corresponds to the infrared supplementary lighting lamp 12, and infrared light emitted by the infrared supplementary lighting lamp 12 penetrates through the supplementary lighting window 1131. The proximity window 1132 corresponds to the proximity infrared lamp 13, and infrared light emitted by the proximity infrared lamp 13 penetrates through the proximity window 1132. The proximity light receiving window 1133 corresponds to the proximity sensor 51, and infrared light reflected by an object may penetrate through the proximity light receiving window 1133 and is incident onto the proximity sensor 51. The packaging top 113 and the packaging sidewall 112 may be integrally formed and may also be split and formed. In an example, all of the supplementary lighting window 1131, the proximity window 1132 and the proximity light receiving window 1133 are through holes, and the material of the packaging top 113 is the material through which the infrared light and visible light cannot be transmitted. In another example, the packaging top 113 is made from the material through which the infrared light cannot be transmitted, a material through which the infrared light may be transmitted and a material through which the visible light cannot be transmitted. Specifically, the supplementary lighting window 1131, the proximity window 1132 and the proximity light receiving window 1133 are made from the material through which the infrared light can be transmitted, and the other parts are made from the materials through which the infrared light cannot be transmitted and the visible light cannot be transmitted. Furthermore, the supplementary lighting window 1131 and the proximity window 1132 may be provided with lens structures to improve the emission angle of the infrared light emitted from the supplementary lighting window 1131 and the proximity window 1132. For example, the supplementary lighting window 1131 is provided with a concave lens structure to diverge and externally emit the light penetrating through the supplementary lighting window 1131. The proximity window 1132 is provided with a convex lens structure to gather and externally emit the light penetrating through the proximity window 1132. The proximity light receiving window 1133 may also be provided with a lens structure to improve an emission angle of the infrared light incident into the proximity light receiving window 1133. For example, the proximity light receiving window 1133 is provided with a convex lens structure to gather and project the light incident into the proximity light receiving window 1133 onto the proximity sensor 51.

The infrared supplementary lighting lamp 12, the proximity infrared lamp 13 and the proximity sensor 51 may be formed on the same chip 14, so that a size formed after the infrared supplementary lighting lamp 12, the proximity infrared lamp 13 and the proximity sensor 51 are integrated is further reduced, and a preparation process is relatively simple. The infrared supplementary lighting lamp 12 may emit the infrared light, the infrared light penetrates through the supplementary lighting window 1131 to be projected onto a surface of the object; and an infrared camera 62 (illustrated in FIG. 1) of the electronic device 100 receives the infrared light reflected by the object to acquire image information of the object (in such case, the infrared supplementary lighting lamp 12 is arranged for infrared supplementary lighting). The proximity infrared lamp 13 may emit the infrared light, and the infrared light penetrates through the proximity window 1132 and reaches the surface of the object. The proximity sensor 51 receives the infrared light incident into the proximity light receiving window 1133 and reflected by the object to determine a distance between the object and the electronic device 100 (in such case, the proximity infrared lamp 13 is arranged for infrared distance measurement). The optical sensor 52 receives the visible light in ambient light and detects an intensity of the visible light (illustrated in FIG. 1).

The infrared supplementary lighting lamp 12 and the proximity infrared lamp 13 may emit the infrared light out of the packaging shell 11 with different power. Specifically, the infrared supplementary lighting lamp 12 and the proximity infrared lamp 13 may simultaneously emit the infrared light, and the output component 10 is simultaneously arranged for infrared supplementary lighting and infrared distance measurement. The infrared supplementary lighting lamp 12 may also emit the light, but the proximity infrared lamp 13 does not emit any light, and the output component 10 is only arranged for infrared supplementary lighting. The infrared supplementary lighting lamp 12 may also not emit any light, but the proximity infrared lamp 13 emits the light, and the output component 10 is only arranged for infrared distance measurement.

Figure 25:
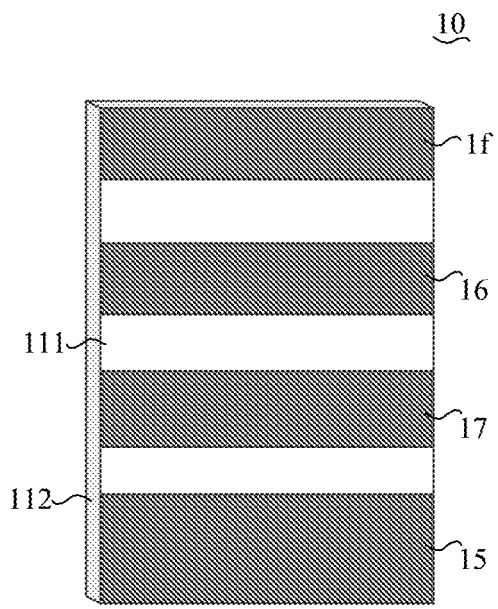
FIG. 25 is a perspective view illustrating an output component of an electronic device according to an embodiment of the present disclosure.

In combination with FIG. 25, in the embodiment of the present disclosure, a grounding pin 15, a supplementary lighting lamp pin 16, a proximity lamp pin 17 and a proximity sensing pin 1f are formed on the output component 10. The grounding pin 15, the supplementary lighting lamp pint 16, the proximity lamp pin 17 and the proximity sensing pin 1f may be formed on the packaging substrate 111. When the grounding pin 15 and the supplementary lighting lamp pin 16 are enabled (that is, the grounding pin 15 and the supplementary lighting lamp pin 16 are connected to a circuit and powered on), the infrared supplementary lighting lamp 12 emits the infrared light. When the grounding pin 15 and the proximity lamp pin 17 are enabled (that is, the grounding pin 15 and the proximity lamp pin 17 are connected to the circuit and powered on), the proximity infrared lamp 13 emits the infrared light. When the grounding pin 15 and the proximity sensing pin 1f are enabled (that is, the grounding pin 15 and the proximity sensing pin 1f are connected to the circuit and powered on), the proximity sensor 51 detects the infrared light externally emitted by the proximity infrared lamp 13 and reflected by the object as a basis for determining the distance between the object and the electronic device 100.

Figure 26:
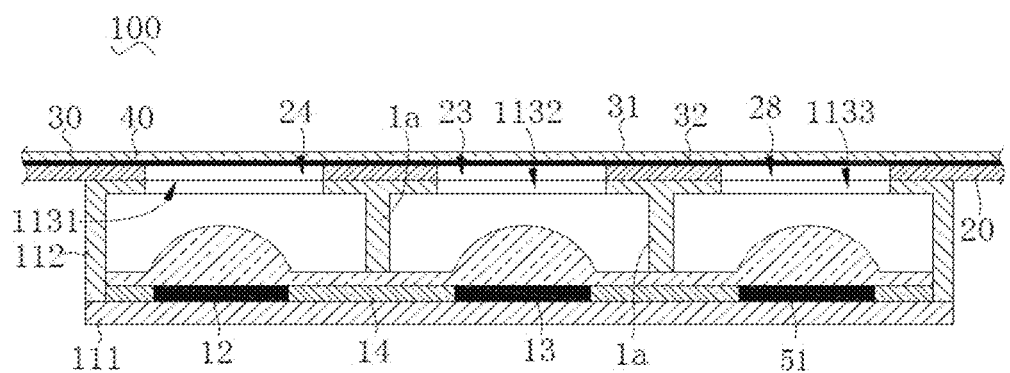
FIG. 26 is a partial sectional view illustrating the electronic device in FIG. 1 along a V-V line.

As illustrated in FIG. 1 and FIG. 26, the enclosure 20 may be used as a mounting carrier/supporter of the output component 10. In other words, the output component 10 may be arranged in the enclosure 20. The enclosure 20 includes a top 21 and a bottom 22. In a state that a user normally uses the electronic device 100, the top 21 is positioned above the bottom 22, as illustrated in FIG. 1. The output component 10 is arranged between the top 21 and the bottom 22. The enclosure 20 is provided with a mounting groove 25. The mounting groove 25 is formed between the top 21 and the bottom 22. The enclosure 20 may be a middle shell or outer shell of the electronic device 100.

Figure 27:
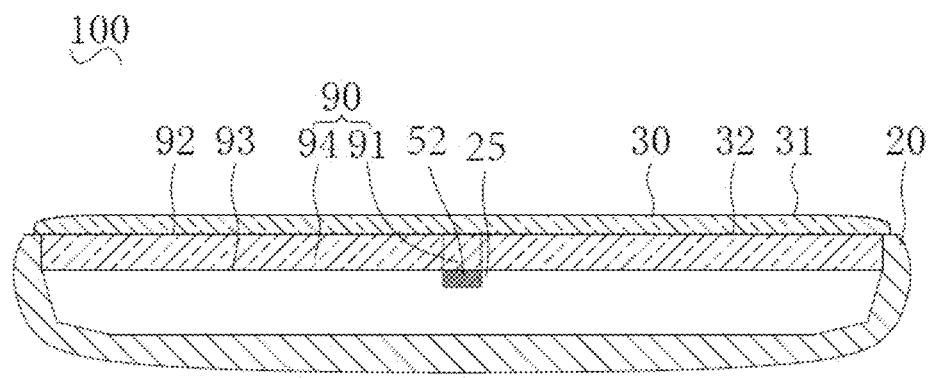
FIG. 27 is a sectional view illustrating the electronic device in FIG. 1 along a VI-VI line.

As illustrated in FIG. 1 and FIG. 27, the display screen 90 is arranged on the enclosure 20 and seals the mounting groove 25 to form a sealed mounting space. Specifically, the display screen 90 is arranged between the top 21 and the bottom 22. The display screen 90 is provided with a non-opaque entity region 91 and an opaque region 94. The non-opaque entity region 91 includes no image pixels and is surrounded by multiple image pixels, and the image pixels are distributed in the opaque region 94. In other words, the opaque region 94 is a display region of the display screen 90 to realize a display function of the display screen 90. A material for the non-opaque entity region 91 includes, but not limited to, glass. The light outside the electronic device 100 may penetrate through the non-opaque entity region 91 and enter the electronic device 100 without damaging integrity of the display screen 90. The display screen 90 includes a front surface 92 capable of displaying a picture and a back surface 93 back on to the front surface 92. Specifically, when the display screen 90 emits light and displays the picture, the light emitted by the display screen 90 is emitted out of the display screen 90 from the front surface 92. When the display screen 90 is mounted on the enclosure 20, the mounting groove 25 and the front surface 92 are positioned on two opposite sides of the back surface 93 (that is, the back surface 93 is positioned between the front surface 92 and the mounting groove 25). In an embodiment of the present disclosure, the output component 10 may be arranged between an edge of the display screen 90 and the top 21. Since the output component 10 in the embodiment of the present disclosure may occupy a relatively small size, a size for arranging the display screen 90 in the enclosure 20 may be correspondingly enlarged to increase a screen-to-body ratio of the electronic device 100. In other embodiment, the display screen 90 may be a full screen/an all screen with a notch, the display screen 90 surrounds the output component 10, and the output component 10 is exposed from the notch of the display screen 90. In at least one embodiment, the non-opaque entity region 91 and the surrounding opaque region 94 are equal in thickness and continuous.

The enclosure 20 is further provided with an enclosure proximity through hole 23, an enclosure supplementary lighting through hole 24 and an enclosure proximity light receiving through hole 28. When the output component 10 is arranged in the enclosure 20, the proximity infrared lamp 13 corresponds to the enclosure proximity through hole 23, the infrared supplementary lighting lamp 12 corresponds to the enclosure supplementary lighting through hole 24, and the proximity sensor 51 corresponds to the enclosure proximity light receiving through hole 28. The condition that the proximity infrared lamp 13 corresponds to the enclosure proximity through hole 23 refers to that the light emitted by the proximity infrared lamp 13 may penetrate through the enclosure proximity through hole 23. Specifically, the proximity infrared lamp 13 may be opposite to the enclosure proximity through hole 23, or the light emitted by the proximity infrared lamp 13 may also penetrate through the enclosure proximity through hole 23 after being subjected to an action of a light guide component. The condition that the infrared supplementary lighting lamp 12 corresponds to the enclosure supplementary lighting through hole 24 is the same as the above and will not be elaborated herein. The condition that the proximity sensor 51 corresponds to the enclosure proximity light receiving through hole 28 refers to that the infrared light reflected by the object may penetrate through the enclosure proximity light receiving through hole 28 and is incident onto the proximity sensor 51. Specifically, the proximity sensor 51 may be opposite to the enclosure proximity light receiving through hole 28, and the incident light of the infrared light may also penetrate through the enclosure proximity light receiving through hole 28 and then is incident onto the proximity sensor 51 after being subjected to the action of the light guide component. In the embodiment illustrated in FIG. 26, the enclosure proximity through hole 23, the enclosure supplementary lighting through hole 24 and the enclosure proximity light receiving through hole 28 may be spaced/separated from one another. Of course, in other embodiment, the enclosure proximity through hole 23, the enclosure supplementary lighting through hole 24 and the enclosure proximity light receiving through hole 28 may also be communicated with one another.

The cover plate 30 may be non-opaque, and a material for the cover plate 30 may be non-opaque glass, resin, plastics and the like. The cover plate 30 is arranged on the enclosure 20. The cover plate 30 includes an inner surface 32 connected with the enclosure 20 and an outer surface 31 back on to the inner surface 32. The light emitted by the output component 10 sequentially penetrates through the inner surface 32 and the outer surface 31 and then penetrates through the cover plate 30. In the embodiment illustrated in FIG. 26, the cover plate 30 covers the enclosure supplementary lighting through hole 24, the enclosure proximity through hole 23 and the enclosure proximity light receiving through hole 28, and the inner surface 32 of the cover plate 30 is coated with infrared transmission ink 40. The infrared transmission ink 40 has relatively high transmittance, for example, capable of reaching 85% or above, for the infrared light and has a relatively high attenuation rate, for example, capable of reaching over 70%, for visible light, so that a region covered by the infrared transmission ink 40 on the electronic device 100 is almost invisible for naked eyes of the user during normal use. Specifically, the infrared transmission ink 40 may cover the region not corresponding to the display screen 90 on the inner surface 32.

The infrared transmission ink 40 may also cover at least one of the enclosure proximity through hole 23, the enclosure supplementary lighting through hole 24 or the enclosure proximity light receiving through hole 28. That is, the infrared transmission ink 40 may simultaneously cover the enclosure proximity through hole 23, the enclosure supplementary lighting through hole 24 and the enclosure proximity light receiving through hole 28 (illustrated in FIG. 26). Then the user may hardly see an internal structure of the electronic device 100 through the enclosure proximity through hole 23, the enclosure supplementary lighting through hole 24 and the enclosure proximity light receiving through hole 28, and the electronic device 100 is relatively attractive in appearance. The infrared transmission ink 40 may also simultaneously cover the enclosure proximity through hole 23 and the enclosure supplementary lighting through hole 24 and not cover the enclosure proximity light receiving through hole 28. The infrared transmission ink 40 may also cover the enclosure proximity through hole 23 and not cover the enclosure supplementary lighting through hole 24 and the enclosure proximity light receiving through hole 28. The infrared transmission ink 40 may also cover the enclosure supplementary lighting through hole 24 and not cover the enclosure proximity through hole 23 and the enclosure proximity light receiving through hole 28. The infrared transmission ink 40 may also simultaneously cover the enclosure proximity through hole 23 and the enclosure proximity light receiving through hole 28 and not cover the enclosure supplementary lighting through hole 24. Or the infrared transmission ink 40 may also simultaneously cover the enclosure supplementary lighting through hole 24 and the enclosure proximity light receiving through hole 28 and not cover the enclosure proximity through hole 23. Or the infrared transmission ink 40 may also cover the enclosure proximity light receiving through hole 28 and not cover the enclosure supplementary lighting through hole 24 and the enclosure proximity through hole 23.

As illustrated in FIG. 27, the optical sensor 52 is a single package. The optical sensor 52 is mounted in the mounting groove 25 and positioned on the side, where the back surface 93 is positioned, of the display screen 90. In other words, the optical sensor 52 is positioned below the display screen 90. The optical sensor 52 corresponds to the non-opaque entity region 91. Specifically, the visible light outside the electronic device 100 may penetrate through the non-opaque entity region 91 and be transmitted to the optical sensor 52. The optical sensor 52 receives the visible light in ambient light and detects an intensity of the visible light as a basis for controlling display brightness of the display screen 90. In the embodiment, the optical sensor 52 is mounted in the mounting groove 25 at first, and then the display screen 90 is mounted on the enclosure 20. The optical sensor 52 may contact with or be spaced from the display screen 90. In another embodiment, the optical sensor 52 may be mounted on the display screen 90, the optical sensor 52 corresponds to the non-opaque entity region 91, and then both of the display screen 90 and the optical sensor 52 are mounted on the enclosure 20.

As illustrated in FIG. 1, the receiver 70 is arranged to externally send an acoustic wave signal when being excited by a power supply, and the user may communicate through the receiver 70. The structured light projector 80 is arranged to externally emit structured light, and the structured light is reflected after being projected onto the measured object. The reflected structured light may be received by the infrared camera 62, and a processor of the electronic device 100 further analyzes the structured light received by the infrared camera 62 to obtain depth information of the measured object.

Figure 28:
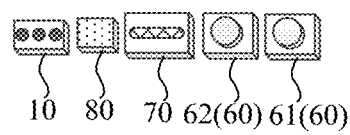
FIG. 28 is an arrangement diagram illustrating electronic elements of an electronic device according to an embodiment of the present disclosure.

In the embodiment illustrated in FIG. 1, the imaging component 60 may include a visible light camera 61 and the infrared camera 62. Centers of the output component 10, the infrared camera 62, the visible light camera 61, the receiver 70 and the structured light project 80 are positioned on the same line segment. Specifically, the output component 10, the structured light projector 80, the receiver 70, the infrared camera 62 and the visible light camera 61 are sequentially arranged from one end to the other end of the line segment (illustrated in FIG. 28). In such case, the visible light camera 61 and the infrared camera 62 may form dual cameras. Or, the output component 10, the infrared camera 62, the receiver 70, the visible light camera 61 and the structured light projector 80 are sequentially arranged from one end to the other end of the line segment (illustrated in FIG. 1). Or, the infrared camera 62, the output component 10, the receiver 70, the visible light camera 61 and the structured light projector 80 are sequentially arranged from one end to the other end of the line segment. Or, the infrared camera 62, the visible light camera 61, the receiver 70, the output component 10 and the structured light projector 80 are sequentially arranged from one end to the other end of the line segment. In such case, the visible light camera 61 and the infrared camera 62 may form dual cameras. Of course, an arrangement manner for the output component 10, the infrared camera 62, the receiver 70, the visible light camera 61 and the structured light project 80 is not limited to the above examples and another manner may also be adopted. For example, the centers of each electronic element are arranged into an arc, or the centers are arranged into a shape such as a rectangle and the like.

In conclusion, in the electronic device 100 of the embodiment of the present disclosure, the output component 10 integrates the infrared supplementary lighting lamp 12, the proximity infrared lamp 13 and the proximity sensor 51 into a single package structure, and a function of emitting and receiving the infrared light for infrared distance measurement and an infrared supplementary lighting function are integrated, so that the output component 10 is relatively high in integration level and relatively small in size, and a space for realizing the infrared supplementary lighting and infrared distance measurement functions is saved by the output component 10. In addition, the infrared supplementary lighting lamp 12, the proximity infrared lamp 13 and the proximity sensor 51 are born on the same packaging substrate 111, which, compared with a conventional process of adopting different wafers to manufacture the infrared supplementary lighting lamp 12, the proximity infrared lamp 13 and the proximity sensor 51 respectively and then combining them onto a PCB substrate, improves packaging efficiency. Meanwhile, the optical sensor 52 is arranged on the side, where the back surface 93 is positioned, of the display screen 90 (below the display screen 90), so that a space between an edge of the display screen 90 and an edge of the enclosure 20 may be prevented from being occupied by the optical sensor 52, and a gap between the edge of the display screen 90 and the edge of the enclosure 20 may be reduced more. That is, the display region of the display screen 90 may be enlarged to increase a screen-to-body ratio of the electronic device 100.

As illustrated in FIG. 24, in at least one embodiment, the output component 10 further includes a supplementary lighting lamp lens 18, a proximity lamp lens 19 and a proximity sensing lens 1e. The supplementary lighting lamp lens 18 is arranged in the packaging shell 11 and corresponds to the infrared supplementary lighting lamp 12. The proximity lamp lens 19 is arranged in the packaging shell 11 and corresponds to the proximity infrared lamp 13. The proximity sensing lens 1e is arranged in the packaging shell 11 and corresponds to the proximity sensor 51. The infrared light emitted by the infrared supplementary lighting lamp 12 is gathered under an action of the supplementary lighting lamp lens 18 in the supplementary lighting window 1131 and then emitted, so as to reduce the amount of light emitted to other regions of the packaging sidewall 112 and the packaging top 113. Similarly, the infrared light emitted by the proximity infrared lamp 13 is gathered under an action of the proximity lamp lens 19 in the proximity window 1132 and then emitted, so as to reduce the amount of the light emitted to the other regions of the packaging sidewall 112 and the packaging top 113. Similarly, when the infrared light entering the proximity light receiving window 1133 and reflected by the object is incident onto the proximity sensing lens 1e, the proximity sensing lens 1e gathers the infrared light on the proximity sensor 51 to reduce the amount of light of the infrared light transmitted to a region except the proximity sensor 51. Specifically, all of the supplementary lighting lamp lens 18, the proximity lamp lens 19 and the proximity sensing lens 1e may be positioned on the same transparent substrate. More specifically, all of the supplementary lighting lamp lens 18, the proximity lamp lens 19 and the proximity sensing lens 1e may be integrally formed with the transparent substrate. Of course, the output component 10 may also be provided with any one or two of the supplementary lighting lamp lens 18, the proximity lamp lens 19 and the proximity sensing lens 1e only, and may also not be provided with the supplementary lighting lamp lens 18, the proximity lamp lens 19 and the proximity sensing lens 1e.

As illustrated in FIG. 24, in at least one embodiment, the output component 10 further includes multiple metal baffle plates 1a. The multiple metal baffle plates 1a are positioned in the packaging shell 11, and the multiple metal baffle plates 1a are positioned between any two of the infrared supplementary lighting lamp 12, the proximity infrared lamp 13 and the proximity sensor 51. When the centers of the infrared supplementary lighting lamp 12, the proximity infrared lamp 13 and the proximity sensor 51 are positioned on the same line segment, the number of the metal baffle plates 1a is two. If the infrared supplementary lighting lamp 12, the proximity infrared lamp 13 and the proximity sensor 51 are sequentially arranged from one end to the other end of the line segment, the two metal baffle plates 1a are positioned between the infrared supplementary lighting lamp 12 and the proximity infrared lamp 13 and between the proximity infrared lamp 13 and the proximity sensor 51 respectively. If the proximity infrared lamp 13, the infrared supplementary lighting lamp 12 and the proximity sensor 51 are sequentially arranged from one end to the other end of the line segment, the two metal baffle plates 1a are positioned between the infrared supplementary lighting lamp 12 and the proximity infrared lamp 13 and between the infrared supplementary lighting lamp 12 and the proximity sensor 51 respectively. If the proximity infrared lamp 13, the proximity sensor 51 and the infrared supplementary lighting lamp 12 are sequentially arranged from one end to the other end of the line segment, the two metal baffle plates 1a are positioned between the proximity sensor 51 and the proximity infrared lamp 13 and between the infrared supplementary lighting lamp 12 and the proximity sensor 51 respectively. When metal baffle plates 1a are positioned between the infrared supplementary lighting lamp 12 and the proximity infrared lamp 13, on the one hand, the metal baffle plate 1a may shield EMI between the infrared supplementary lighting lamp 12 and the proximity infrared lamp 13 and avoid mutual influence of luminous intensities and time sequences of the infrared supplementary lighting lamp 12 and the proximity infrared lamp 13, and on the other hand, the metal baffle plate 1a may be arranged to isolate a cavity where the infrared supplementary lighting lamp 12 is positioned from a cavity where the proximity infrared lamp 13 is positioned, and then the light is unlikely to enter the other cavity from one cavity. When the metal baffle plates 1a are positioned between the infrared supplementary lighting lamp 12 and the proximity sensor 51 or positioned between the proximity sensor 51 and the proximity infrared lamp 13, incidence of the infrared light initially emitted by the infrared supplementary lighting lamp 12 and the proximity infrared lamp 13 onto the proximity sensor 51 may be avoided, and EMI between the infrared supplementary lighting lamp 12 and the proximity sensor 51 or EMI between the proximity infrared lamp 13 and the proximity sensor 51 may also be shielded.

Figure 29:
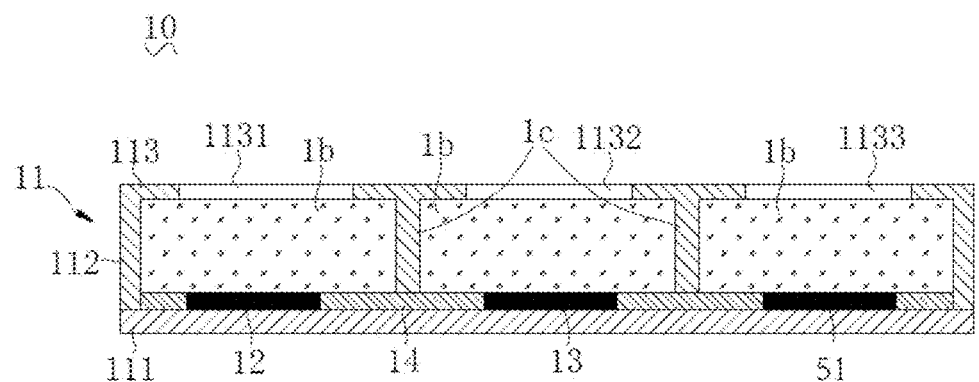
FIG. 29 is a sectional view illustrating an output component according to an embodiment of the present disclosure.

As illustrated in FIG. 29, in at least one embodiment, the output component 10 further includes an optical sealing cover 1b. The optical sealing cover 1b is made from a non-opaque material, and the optical sealing cover 1b is formed on the packaging substrate 111 and positioned in the packaging shell 11. The optical sealing cover 1b wraps/encases the infrared supplementary lighting lamp 12, the proximity infrared lamp 13 and the proximity sensor 51. Specifically, the optical sealing cover 1b may be formed by a glue feed injection molding/gel-casting process, and the optical sealing cover 1b may be made from a transparent thermosetting epoxy resin and thus is unlikely to soften during use. The optical sealing cover 1b may fix a relative position of the infrared supplementary lighting lamp 12, the proximity infrared lamp 13 and the proximity sensor 51, so that the infrared supplementary lighting lamp 12, the proximity infrared lamp 13 and the proximity sensor 51 are not easily shaken/swayed in the packaging shell 11.

In addition, as illustrated in FIG. 29, the output component 10 further includes multiple light output baffle plates 1c, and the multiple light output baffle plates 1c are formed in the optical sealing cover 1b and positioned among the infrared supplementary lighting lamp 12, the proximity infrared lamp 13 and the proximity sensor 51. When the centers of the infrared supplementary lighting lamp 12, the proximity infrared lamp 13 and the proximity sensor 51 are positioned on the same line segment, the number of the light output baffle plates 1c is two. If the infrared supplementary lighting lamp 12, the proximity infrared lamp 13 and the proximity sensor 51 are sequentially arranged from one end to the other end of the line segment, the two light output baffle plates 1c are positioned between the infrared supplementary lighting lamp 12 and the proximity infrared lamp 13 and between the proximity infrared lamp 13 and the proximity sensor 51 respectively. If the proximity infrared lamp 13, the infrared supplementary lighting lamp 12 and the proximity sensor 51 are sequentially arranged from one end to the other end of the line segment, the two light output baffle plates 1c are positioned between the infrared supplementary lighting lamp 12 and the proximity infrared lamp 13 and between the infrared supplementary lighting lamp 12 and the proximity sensor 51 respectively. If the proximity infrared lamp 13, the proximity sensor 51 and the infrared supplementary lighting lamp 12 are sequentially arranged from one end to the other end of the line segment, the two light output baffle plates 1c are positioned between the proximity sensor 51 and the proximity infrared lamp 13 and between the infrared supplementary lighting lamp 12 and the proximity sensor 51 respectively. The light output baffle plates 1c may be arranged to space/separate the infrared supplementary lighting lamp 12 from the proximity infrared lamp 13, so as to ensure that the light emitted by the infrared supplementary lighting lamp 12 may not penetrate through the proximity window 1132, and the light emitted by the proximity infrared lamp 13 may not penetrate through the supplementary lighting window 1131. The light output baffle plates 1c may prevent incidence of the infrared light initially emitted by the infrared supplementary lighting lamp 12 and the proximity infrared lamp 13 onto the proximity sensor 51 and simultaneously prevent influence of the infrared light entering the proximity light receiving window 1133 and emitted to the proximity sensor 51 on light emission of the infrared supplementary lighting lamp 12 and the proximity infrared lamp 13.

As illustrated in FIG. 1 and FIG. 27, in at least one embodiment, the non-opaque entity region 91 includes image pixels, the electronic device 100 further includes a processor 96, and the optical sensor 52 receives the light incident onto the optical sensor 52 to output an initial light intensity including ambient light intensity information outside the electronic device 100. The processor 96 is arranged to process the initial light intensity to obtain a target light intensity only including the ambient light intensity information outside the electronic device 100.

Specifically, the non-opaque entity region 91 includes the image pixels. The non-opaque entity region 91 may be arranged to display image information and, meanwhile, ambient light may penetrate through the non-opaque entity region 91 and enter the electronic device 100. In at least one embodiment, transmittance of the non-opaque entity region 91 may be more/greater than or equal to 50%. It can be understood that the light incident onto the optical sensor 52 not only includes part of the ambient light penetrating through the non-opaque entity region 91 but also includes part of display light emitted into the electronic device 100 by the image pixels of the non-opaque entity region 91 when a content is displayed. The processor 96 may determine the display light received by the optical sensor 52 and emitted to the optical sensor 52 from the non-opaque entity region 91 according to the content displayed by the non-opaque entity region 91, and thus the processor 96 may determine the target light intensity only including the ambient light intensity information outside the electronic device 100 according to both of the initial light intensity and a light intensity generated by the display light received by the optical sensor 52. The electronic device 100 of the embodiment may obtain the ambient light intensity information outside the electronic device 100 as the basis for controlling the display brightness of the display screen 90.

As illustrated in FIG. 1 and FIG. 27, in at least one embodiment, the initial light intensity includes the ambient light intensity information and display light intensity information received by the optical sensor 52 when the display screen 90 displays an image. The processor 96 is arranged to acquire the display light intensity information received by the optical sensor 52 when the display screen 90 displays the image in real time and, when processing the initial light intensity, to eliminate the display light intensity information to obtain the target light intensity.

Figure 30:
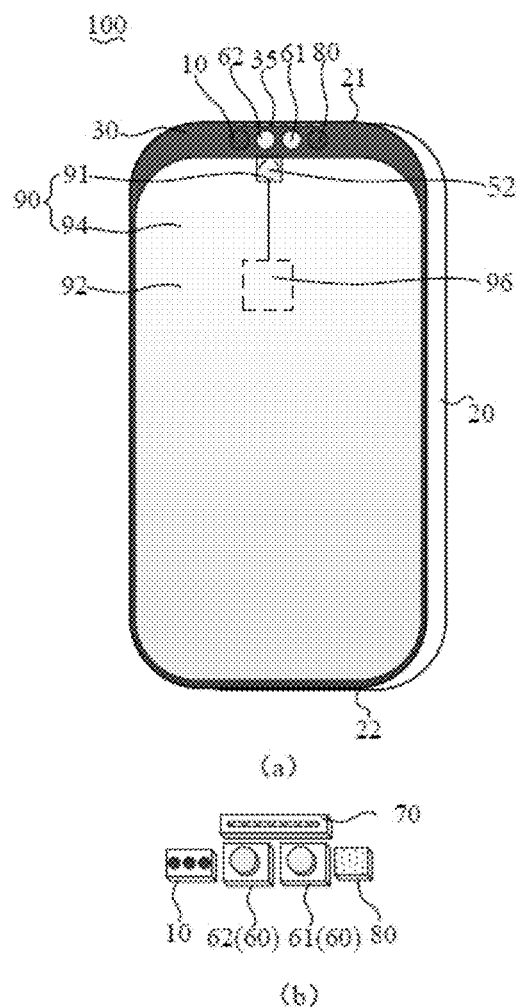
FIG. 30 is a structure diagram illustrating an electronic device according to an embodiment of the present disclosure.

As illustrated in FIG. 30, in at least one embodiment, the enclosure 20 is also provided with an enclosure sound output hole (not illustrated in the figure), the cover plate 30 is also provided with a cover plate sound output hole 35, and the receiver 70 corresponds to positions of the cover plate sound output hole 35 and the enclosure sound output hole. The centers of the output component 10, the infrared camera 62, the visible light camera 61 and the structured light projector 80 are positioned on the same line segment, and the receiver 70 is positioned between the line segment and the top 21 of the enclosure 20.

The center of the receiver 70 is not positioned on the line segment, so that a transverse space occupied by each electronic element (the output component 10, the infrared camera 62, the visible light camera 61, the structured light projector 80 and the like) on the cover plate 30 is saved. In the embodiment illustrated in FIG. 30, the cover plate sound output hole 35 is formed in an edge position of the cover plate 30, and the enclosure sound output hole is formed close to the top 21.

Figure 31:
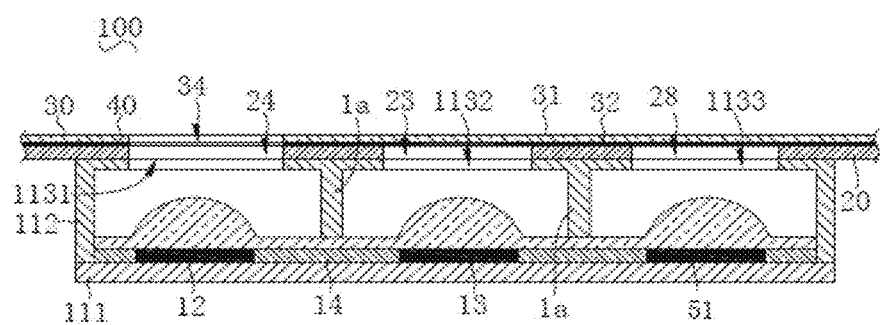
FIG. 31 to FIG. 33 are partial sectional views illustrating electronic devices along a position corresponding to the V-V line in FIG. 1 according to some embodiments of the present disclosure.

As illustrated in FIG. 31, in at least one embodiment, a cover plate supplementary lighting through hole 34 may also be formed in the cover plate 30, and the cover plate supplementary lighting through hole 34 corresponds to the enclosure supplementary lighting through hole 24. The infrared light emitted by the infrared supplementary lighting lamp 12, after penetrating through the enclosure supplementary lighting through hole 24, may penetrate through the electronic device 100 from the cover plate supplementary lighting through hole 34. In such case, the infrared transmission ink 40 may be arranged at a position corresponding to the enclosure proximity through hole 23 on the cover plate 30. Then, the user is unlikely to see the proximity infrared lamp 13 in the electronic device 100 through the enclosure proximity through hole 23, and the electronic device 100 is relatively attractive in appearance.

Figure 32:
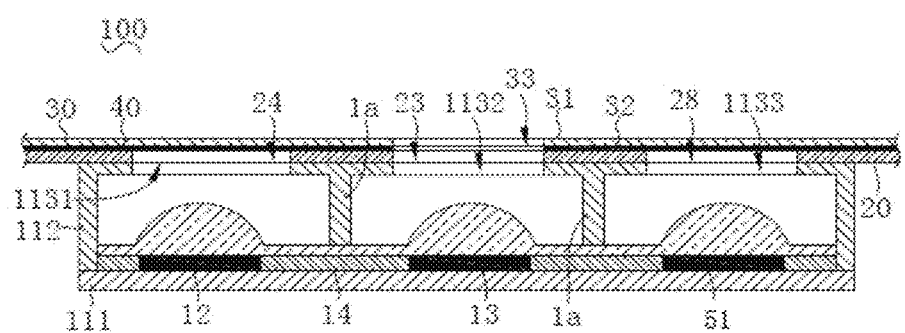

As illustrated in FIG. 32, in at least one embodiment, a cover plate proximity through hole 33 may also be formed in the cover plate 30, and the cover plate proximity through hole 33 corresponds to the enclosure proximity through hole 23. The infrared light emitted by the proximity infrared lamp 13, after penetrating through the enclosure proximity through hole 23, may penetrate through the electronic device 100 from the cover plate proximity through hole 33. In such case, the infrared transmission ink 40 may be arranged at a position corresponding to the enclosure supplementary lighting through hole 24 on the cover plate 30. The user may hardly see the infrared supplementary lighting lamp 12 in the electronic device 100 through the enclosure supplementary lighting through hole 24, and the electronic device 100 is relatively attractive in appearance.

Figure 33:
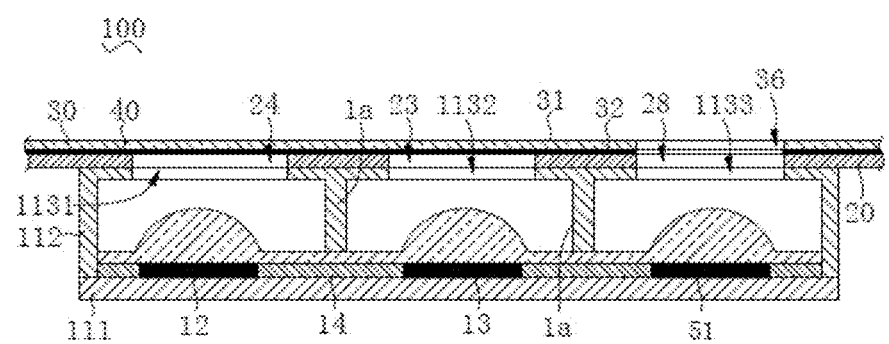

As illustrated in FIG. 33, in at least one embodiment, a cover plate proximity light receiving through hole 36 may also be formed in the cover plate 30, the cover plate proximity light receiving through hole 36 corresponds to both of the enclosure proximity light receiving through hole 28 and the proximity sensor 51. The infrared light reflected by the object outside the electronic device 100, after penetrating through the cover plate proximity light receiving through hole 36 and the enclosure proximity light receiving through hole 28, may be incident onto the proximity sensor 51.

In the descriptions of the specification, the descriptions made with reference to terms "certain embodiment/at least one embodiment", "an embodiment", "some embodiments", "schematic embodiment", "example", "specific example", "some examples" or the like refer to that specific features, structures, materials or characteristics described in combination with the embodiments or the examples are included in at least one embodiment or example of the present disclosure. In the specification, these terms are not always schematically expressed for the same embodiment or example. Moreover, the specific described features, structures, materials or characteristics may be combined in a proper manner in any one or more embodiments or examples.

In addition, terms "first" and "second" are only adopted for description and should not be understood to indicate or imply relative importance or implicitly indicate the number of indicated technical features and thus should not be understood as limits to the application. Therefore, a feature defined by "first" and "second" may explicitly or implicitly indicate inclusion of at least one such feature. In the descriptions of the present disclosure, "multiple" means at least two, for example, two and three, unless otherwise limited definitely and specifically.

The embodiments of the present disclosure have been illustrated or described above. However, it can be understood that the abovementioned embodiments are exemplary and should not be understood as limits to the present disclosure and those skilled in the art may make variations, modifications, replacements, transformations to the abovementioned embodiments within the scope of the present disclosure. The scope of the present disclosure is defined by the claims and equivalents thereof.

The invention claimed is:

1. An electronic device, comprising:
   an enclosure;
   an output component, wherein the output component is mounted on the enclosure, and the output component comprises a packaging shell, an infrared supplementary lighting lamp and a proximity infrared lamp; the packaging shell comprises a packaging substrate; the infrared supplementary lighting lamp and the proximity infrared lamp are packaged in the packaging shell and born on the packaging substrate; and the infrared supplementary lighting lamp and the proximity infrared lamp are capable of emitting infrared light out of the packaging shell with different power;
   a display screen, wherein the display screen is arranged on the enclosure, and the display screen is provided with a non-opaque entity region and comprises a front surface capable of displaying a picture and a back surface back on to the front surface; and
   an optical sensor, wherein the optical sensor is arranged on a side, where the back surface is positioned, of the display screen; the optical sensor corresponds to the non-opaque entity region, and the optical sensor is arranged to receive light incident onto the optical sensor and output a target light intensity of the light.

2. The electronic device of claim 1, further comprising a main board, an imaging component and a proximity sensor; wherein
   the main board is mounted in the enclosure and provided with a mounting notch;
   the imaging component is mounted in the enclosure and corresponds to the mounting notch;
   the proximity sensor is connected to the main board and extends into the mounting notch from an edge of the mounting notch; and the proximity sensor is partially overlapped with the imaging component in a depth direction of the mounting notch.

3. The electronic device of claim 1, further comprising an imaging component and a proximity sensor; wherein the imaging component is mounted on the enclosure, and the proximity sensor is mounted on the imaging component.

4. The electronic device of claim 3, wherein the imaging component comprises a camera shell and a lens component; a top surface of the camera shell is a stepped surface and comprises a first top subsurface and a second top subsurface which is connected with the first top subsurface; the second top subsurface is inclined relative to the first top subsurface and forms a cut with the first top subsurface; the top surface is provided with a light output through hole, and the lens component is accommodated in the camera shell and corresponds to the light output through hole; and the proximity sensor is arranged at the first top subsurface.

5. The electronic device of claim 3, wherein the imaging component comprises a camera shell and two lens components, and a cut is formed in a top surface of the camera shell to form a stepped top surface; the top surface comprises a first stepped surface and a second stepped surface at a level lower than that of the first stepped surface, two light output through holes are formed in the first stepped surface, and the light output through holes correspond to the lens components; and the proximity sensor is arranged at the second stepped surface.

6. The electronic device of claim 3, wherein the imaging component comprises a lens mount, a lens barrel mounted on the lens mount and a substrate partially arranged in the lens mount; and the proximity sensor is arranged on the substrate.

7. The electronic device of claim 1, further comprising a proximity sensor, and the proximity sensor are combined with the output component; the infrared supplementary lighting lamp, the proximity infrared lamp and the proximity sensor are all packaged in the packaging shell and born on the packaging substrate; and the proximity sensor is arranged to receive the infrared light reflected by an object to detect a distance between the object and the electronic device.

8. The electronic device of claim 1, wherein the output component further comprises a chip, and the infrared supplementary lighting lamp and the proximity infrared lamp are formed on the same chip.

9. The electronic device of claim 8, wherein the packaging shell further comprises a packaging sidewall and a packaging top; the packaging sidewall extends from the packaging substrate and is connected between the packaging top and the packaging substrate; a supplementary lighting window and a proximity window are formed in the packaging top, the supplementary lighting window corresponds to the infrared supplementary lighting lamp, and the proximity window corresponds to the proximity infrared lamp.

10. The electronic device of claim 8, wherein the output component further comprises at least one of a supplementary lighting lamp lens or a proximity lamp lens; wherein the supplementary lighting lamp lens is arranged in the packaging shell and corresponds to the infrared supplementary lighting lamp; and
the proximity lamp lens is arranged in the packaging shell and corresponds to the proximity infrared lamp.

11. The electronic device of claim 8, wherein the output component further comprises a metal baffle plate, and the metal baffle plate is positioned in the packaging shell and positioned between the infrared supplementary lighting lamp and the proximity infrared lamp.

12. The electronic device of claim 1, wherein the output component further comprises an optical sealing cover made from a non-opaque material; the optical sealing cover is formed on the packaging substrate and positioned in the packaging shell, and the optical sealing cover wraps the infrared supplementary lighting lamp and the proximity infrared lamp.

13. The electronic device of claim 12, wherein the output component further comprises a light output baffle plate, and the light output baffle plate is formed in the optical sealing cover and positioned between the infrared supplementary lighting lamp and the proximity infrared lamp.

14. The electronic device of claim 1, further comprising a non-opaque cover plate, wherein the enclosure is provided with an enclosure proximity through hole and an enclosure supplementary lighting through hole; the proximity infrared lamp corresponds to the enclosure proximity through hole, the infrared supplementary lighting lamp corresponds to the enclosure supplementary lighting through hole, and the cover plate is arranged on the enclosure.

15. The electronic device of claim 7, wherein the output component further comprises a chip; and the infrared supplementary lighting lamp, the proximity infrared lamp and the proximity sensor are all formed on the same chip.

16. The electronic device of claim 15, wherein the packaging shell further comprises a packaging sidewall and a packaging top; the packaging sidewall extends from the packaging substrate and is connected between the packaging top and the packaging substrate; a supplementary lighting window, a proximity window and a proximity light receiving window are formed in the packaging top; the supplementary lighting window corresponds to the infrared supplementary lighting lamp, the proximity window corresponds to the proximity infrared lamp, and the proximity light receiving window corresponds to the proximity sensor.

17. The electronic device of claim 15, wherein the output component further comprises at least one of a supplementary lighting lamp lens, a proximity lamp lens or a proximity sensing lens; wherein the supplementary lighting lamp lens is arranged in the packaging shell and corresponds to the infrared supplementary lighting lamp;
the proximity lamp lens is arranged in the packaging shell and corresponds to the proximity infrared lamp; and
the proximity sensing lens is arranged in the packaging shell and corresponds to the proximity sensor.

18. The electronic device of claim 15, wherein the output component further comprises multiple metal baffle plates, and the multiple metal baffle plates are positioned in the packaging shell and positioned between any two of the infrared supplementary lighting lamp, the proximity infrared lamp and the proximity sensor respectively.

19. The electronic device of claim 7, wherein the output component further comprises an optical sealing cover made from a non-opaque material; the optical sealing cover is formed on the packaging substrate and positioned in the packaging shell, and the optical sealing cover wraps the infrared supplementary lighting lamp, the proximity infrared lamp and the proximity sensor;
wherein the output component further comprises multiple light output baffle plates, and the multiple light output baffle plates are formed in the optical sealing cover and positioned between any two of the infrared supplementary lighting lamp, the proximity infrared lamp and the proximity sensor respectively.

20. An electronic device, comprising: an output component,
wherein the output component comprises a packaging shell, an infrared supplementary lighting lamp and a proximity infrared lamp; the packaging shell comprises a packaging substrate; the infrared supplementary lighting lamp and the proximity infrared lamp are packaged in the packaging shell and born on the packaging substrate; and the infrared supplementary lighting lamp and the proximity infrared lamp are capable of emitting infrared light out of the packaging shell with different power.

* * * * *